United States Patent
Tsuda

(10) Patent No.: US 9,083,305 B2
(45) Date of Patent: Jul. 14, 2015

(54) ACOUSTIC WAVE FILTER

(71) Applicant: NIHON DEMPA KOGYO CO., LTD., Tokyo (JP)

(72) Inventor: Tadaaki Tsuda, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 276 days.

(21) Appl. No.: 13/647,393

(22) Filed: Oct. 9, 2012

(65) Prior Publication Data

US 2013/0088308 A1   Apr. 11, 2013

(30) Foreign Application Priority Data

Oct. 11, 2011 (JP) ................... 2011-224028

(51) Int. Cl.
*H03H 9/145* (2006.01)
*H03H 9/64* (2006.01)

(52) U.S. Cl.
CPC ....... *H03H 9/14535* (2013.01); *H03H 9/14558* (2013.01); *H03H 9/14552* (2013.01)

(58) Field of Classification Search
CPC .......... H03H 9/14526; H03H 9/14535; H03H 9/0296; H03H 9/1455; H03H 9/6463; H03H 9/6466
USPC ................................. 333/193–196
See application file for complete search history.

(56) References Cited

U.S. PATENT DOCUMENTS

| | | | | | |
|---|---|---|---|---|---|
| 3,801,935 | A | * | 4/1974 | Mitchell | 333/193 |
| 4,223,284 | A | * | 9/1980 | Inoue et al. | 333/150 |
| 5,682,126 | A | * | 10/1997 | Plesski et al. | 333/193 |
| 5,818,310 | A | * | 10/1998 | Solie | 333/196 |
| 5,831,492 | A | * | 11/1998 | Solie | 333/193 |
| 5,952,765 | A | * | 9/1999 | Garber et al. | 310/313 B |
| 6,744,333 | B2 | * | 6/2004 | Sawada | 333/133 |
| 6,870,302 | B2 | * | 3/2005 | Nakamura et al. | 310/313 B |
| 2009/0322449 | A1 | | 12/2009 | Tsuda | |

FOREIGN PATENT DOCUMENTS

| | | |
|---|---|---|
| JP | 11-500593 | 1/1999 |
| JP | 2010-010961 | 1/2010 |
| JP | 2011-211414 | 10/2011 |

* cited by examiner

*Primary Examiner* — Dean Takaoka
*Assistant Examiner* — Alan Wong
(74) *Attorney, Agent, or Firm* — Jianq Chyun IP Office

(57) ABSTRACT

Disclosed is a pass band type acoustic wave filter capable of obtaining an excellent attenuation characteristic in attenuation bands, in which an IDT electrode having a meander structure is used as at least one of the input-side electrode and the output-side electrode, and the attenuation band is provided over/under the pass band. An electrode having a meander structure in which a plurality of IDT blocks are connected to each other in series between the input port or the output port and the ground port is arranged as the input-side IDT electrode and the output-side IDT electrode, and the electrode finger between the neighboring IDT blocks is removed, so as to suppress excitation of an undesired acoustic wave.

6 Claims, 20 Drawing Sheets

REMOVED

ACOUSTIC WAVE FILTER

CROSS-REFERENCE TO RELATED APPLICATION

This application claims the priority benefit of Japan application serial no. 2011-224028, filed on Oct. 11, 2011. The entirety of the above-mentioned patent application is hereby incorporated by reference herein and made a part of this specification.

TECHNICAL FIELD

The present invention relates to an acoustic wave filter such as a surface acoustic wave (SAW) filter.

DESCRIPTION OF THE RELATED ART

There is known a surface acoustic wave (SAW, hereinafter referred to as "acoustic wave") filter as a bandpass filter used in various communication fields. In recent years, as wireless data communication becomes faster and requires a larger capacity, a demand for a bandpass filter having low loss, a bandwidth, high flatness, high selectivity, and a miniaturized size increases year by year. In order to respond to such a demand, a tapered filter is advantageously employed.

In the tapered filter, a group of electrode fingers are arranged in a tapered shape between a pair of bus bars of an inter-digital transducer (IDT) electrode, and the IDT electrodes are arranged side by side on a piezoelectric substrate along the acoustic wave propagation direction as an input-side electrode and an output-side electrode. In each IDT electrode, for example, an input port or an output port is connected to one of a pair of bus bars, and a ground port is connected to the other bus bar.

In addition, as one of the configurations of the IDT electrodes, there is known a distributed acoustic reflection transducer (DART) type electrode in which three neighboring electrode fingers 101 extending from one of the bus bars 100 and a single electrode finger 101 neighboring to the three electrode fingers 101 and extending from the other bus bar 100 are cyclically arranged side by side as illustrated in FIG. 22.

Recently, as such an IDT electrode, a so-called meander structure is employed, in which the IDT electrodes are folded back in an accordion shape in the middle portion as illustrated in FIG. 22 in order to suppress influence of diffraction of an acoustic wave and appropriately increase impedance. This structure will be described in brief by focusing on the input-side electrode 105 of FIG. 22. The input-side electrode 105 in the acoustic wave propagation direction is divided into, for example, three blocks 107, and the input port 110 is connected to the far-side bus bar 100 of the right-side block 107. In addition, the near-side bus bar 100 in the right-side block 107 and the near-side bus bar 100 in the center block 107 are connected to each other, and the far-side bus bar 100 in the center block 107 and the far-side bus bar 100 in the left-side block 107 are connected to each other. Furthermore, the near-side bus bar 100 in the left-side block 107 is connected to the ground port 111.

Here, in such a meander structure, an undesired acoustic wave is unintentionally excited between the neighboring blocks 107 and 107. For this reason, a transfer response characteristic is changed from a design value, and an attenuation characteristic is deteriorated. Patent Literature 1 discloses the meander structure described above, but fails to describe this problem.

[Patent Literature 1] Japanese Patent Application Laid-open No. H11-500593 (FIGS. 12 to 15)

SUMMARY

The present invention has been made in view of the aforementioned problems, and an aim thereof is to provide a pass band type acoustic wave filter capable of obtaining an excellent attenuation characteristic in attenuation bands, in which an IDT electrode having a meander structure is used as at least one of the input-side electrode and the output-side electrode, and the attenuation band is respectively provided over/under the pass band.

According to an aspect of the present invention, there is provided an acoustic wave filter including an input-side IDT electrode and an output-side IDT electrode arranged on a piezoelectric substrate along an acoustic wave propagation direction and separated from each other, wherein at least one of the IDT electrodes is configured such that:

(1) electrode fingers extends from each of a pair of bus bars arranged in parallel with each other to extend along an acoustic wave propagation direction to an opposite bus bar side, so that a plurality of IDT blocks in which a group of electrode fingers are arranged in a comb-tooth shape are arranged side by side along the acoustic wave propagation direction and are connected in series through each of the bus bars;

(2) a first signal port and a second signal port are connected to the bus bars located in both ends of a group of the IDT blocks connected to each other in series;

(3) a group of the electrode fingers of each IDT block is configured such that a period unit including three neighboring electrode fingers extending from one of the bus bars located in the first signal port side as seen in a plan view and a single electrode finger neighboring to the three electrode fingers and extending from the other bus bar out of a pair of the bus bars of each IDT block is cyclically repeated along the acoustic wave propagation direction, and an interval between the neighboring IDT blocks is set such that the period unit is cyclically repeated in the IDT electrode; and (4) a space area is formed instead of at least one of an electrode finger in the other IDT block side of one of the IDT blocks and an electrode finger in the one of the IDT block side of the other IDT block in order to suppress excitation of an undesired acoustic wave between the neighboring IDT blocks.

In the acoustic wave filter described above, the interval between the neighboring IDT blocks may be set to a dimension different from a dimension corresponding to the period unit in order to suppress a phase deviation in the acoustic wave caused by forming the space area.

In the acoustic wave filter described above, the electrode finger extending from the one of the bus bars may be arranged instead of the electrode finger extending from the other bus bar in order to thin an acoustic wave excitation position.

In the acoustic wave filter described above, an reflection electrode may be arranged instead of the two neighboring electrode fingers extending from the one of the bus bars.

In the acoustic wave filter described above, an electrode finger extending from the one of the bus bars may be arranged in each of the other IDT block side of one of the IDT blocks and the one of the IDT blocks side of the other IDT block out of the neighboring IDT blocks in order to suppress generation of an electric field between the IDT blocks.

In the acoustic wave filter described above, two neighboring period units may be formed such that the electrode finger extending from the other bus bar in one of the period units and any one of the three electrode fingers extending from the one of the bus bars in the other period unit are exchanged with each other to reverse an acoustic wave excitation position by 180° in the period units.

According to the present invention, an IDT electrode having a meander structure in which a plurality of IDT blocks are connected in series with each other between the first signal port and the second signal port and are arranged side by side along the acoustic wave propagation direction is provided as at least one of the input-side electrode and the output-side electrode. In addition, the IDT electrode is configured as a DART type electrode in which a period unit including three electrode fingers extending from one of the bus bars and a single electrode finger extending from the other bus bar is cyclically repeated along the acoustic wave propagation direction, and at least one of the electrode fingers between the neighboring blocks is removed. For this reason, since the electrode finger is removed, it is possible to suppress excitation of an undesired acoustic wave between the corresponding electrode finger and the block neighboring to this electrode finger. Therefore, it is possible to suppress deterioration of the transfer response characteristic and obtain an excellent attenuation characteristic.

DETAILED DESCRIPTION

Figure 1:
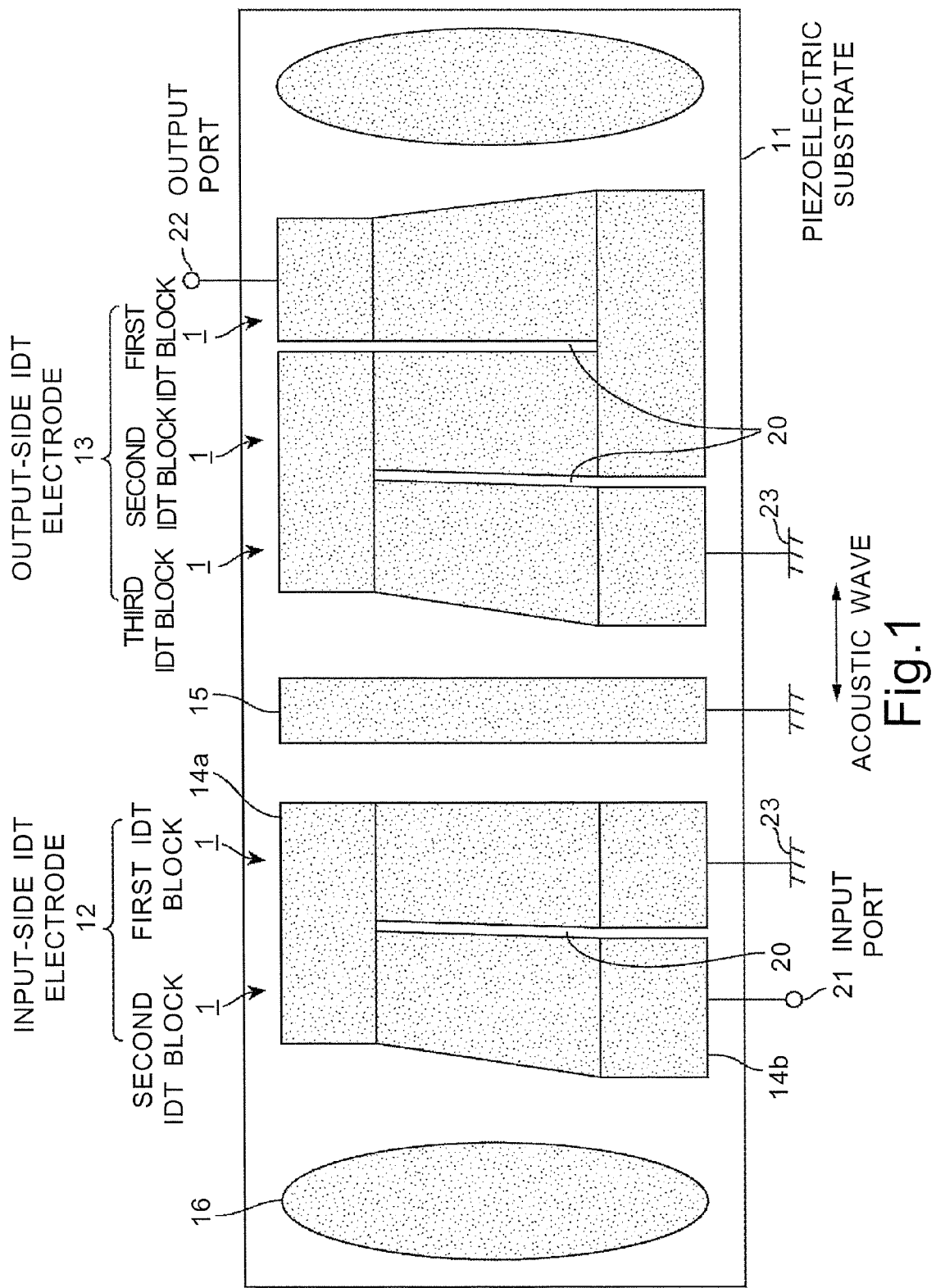
FIG. 1 is a top plan view illustrating an example of the acoustic wave filter according to an embodiment of the prevent invention.

A surface acoustic wave (SAW) filter, as an example of an acoustic wave filter according to an embodiment of the disclosure, will be described with reference to FIGS. 1 to 8. The acoustic wave filter includes tapered input-side IDT electrodes 12 and output-side IDT electrodes 13 arranged side by side with an interval along an acoustic wave propagation direction (left-right direction), and the tapered input-side IDT electrodes 12 and output-side IDT electrodes 13 are disposed on a piezoelectric substrate 11 which is made of, for example, lithium niobate ($LiNbO_3$) and the like, so that the acoustic wave filter serves as a bandpass filter having an attenuation band over/under the pass band as described later. In this example, the input-side IDT electrode 12 and the output-side IDT electrode 13 are arranged in the left side and the right side, respectively, in FIG. 1. In FIG. 1, there are also provided an input port 21, an output port 22, a ground port 23, a shield electrode 15, and an acoustic absorbent material (damper) 16 for absorbing an undesired acoustic wave propagating to the end portion of the piezoelectric substrate 11. Note that, in the following description, a direction perpendicular to the acoustic wave propagation direction will be referred to as a forward-backward direction.

Figure 2:
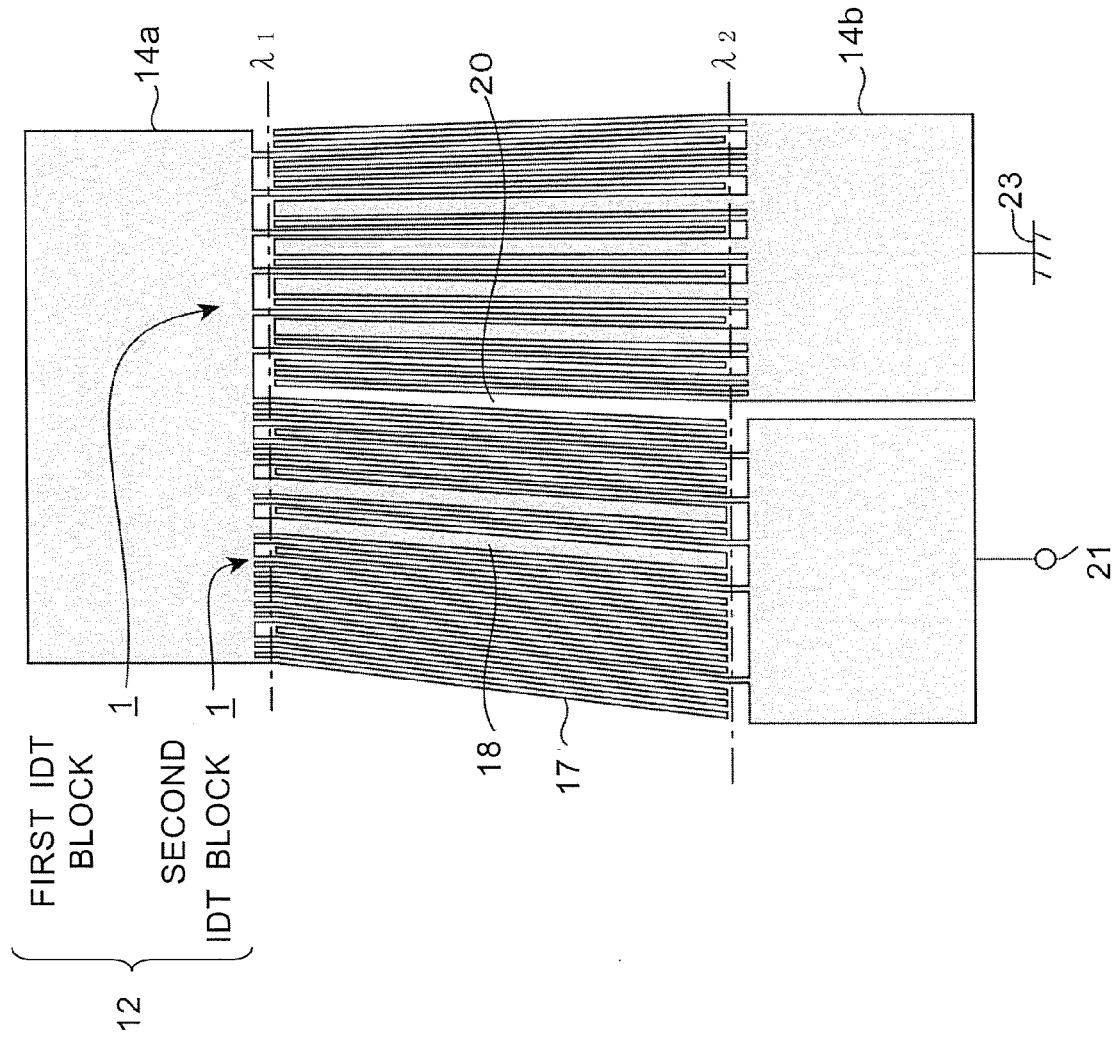
FIG. 2 is a top plan view illustrating an input-side IDT electrode of the acoustic wave filter described above.

First, description will be made for the input-side IDT electrode 12. Referring to FIG. 2, the input-side IDT electrode 12 is divided into a plurality of IDT blocks (e.g., two IDT blocks 1 and 1 in this example) along the acoustic wave propagation direction. A meander structure is employed, in which these IDT blocks 1 and 1 are connected in series with each other between the input port 21 and the ground port 23. That is, each of the IDT blocks 1 and 1 includes a pair of bus bars 14 and 14 arranged in parallel with each other along the acoustic wave propagation direction and a plurality of electrode fingers 17 formed to extend in a comb-tooth shape from the bus bars 14 and 14 toward the respective opposite bus bars 14 and 14. In addition, the right-side IDT block 1 out of a pair of the IDT blocks 1 and 1 is referred to as a first IDT block 1, and the left-side IDT block 1 out of a pair of the IDT blocks 1 and 1 is referred to as a second IDT block 1. The ground port 23 is connected to the near-side bus bar 14 of the first IDT block 1. The far-side bus bar 14 of the first IDT block 1 extends to the left side toward the second IDT block 1 and is connected to the far-side bus bar 14 of the second IDT block 1 neighboring to the corresponding bus bar 14. The near-side bus bar 14 of the second IDT block 1 is connected to the input port 21. As a result, the first IDT block 1 and the second IDT block 1 are sequentially connected in series between the input port 21 and the ground port 23, and these IDT blocks 1 and 1 are arranged side by side to neighbor each other along the acoustic wave propagation direction. In this example, the ground port 23 serves as the first signal port, and the input port 21 serves as the second signal port. Note that, in FIG. 1, each IDT block 1 is not illustrated for brevity purposes.

In each of the IDT blocks 1 and 1, if the far-side bus bar 14 and the near-side bus bar 14 are denoted by the reference numerals 14a and 14b, respectively, a DART structure is employed in the electrode fingers 17 each extending from these bus bars 14a and 14b, in each of the IDT blocks 1 and 1. That is, in the first IDT block 1, a structure including three neighboring electrode fingers 17 extending from the near-side bus bar 14b and a single electrode finger 17 neighboring to the three electrode fingers 17 and extending from the far-side bus bar 14a is cyclically repeated along the acoustic wave propagation direction.

If a period length (period unit) of the four electrode fingers 17 repeated along the acoustic wave propagation direction is denoted by $\lambda$, widths of each electrode fingers 17 and gaps between neighboring electrode fingers 17 and 17 in the first IDT block 1 are set such that this period length $\lambda$, is widened from the far-side bus bar 14a to the near-side bus bar 14b so as to provide a tapered shape. Therefore, the period lengths $\lambda$ in the area close to the far-side bus bar 14a and the area close to the near-side bus bar 14b are set to $\lambda 1$ and $\lambda 2$, respectively ($\lambda 1 < \lambda 2$). Note that, in FIG. 2 and the like, the widths of the electrode fingers 17 and the intervals between the neighboring electrode fingers 17 and 17 are illustrated just schematically.

In the first IDT block 1, in order to suppress the acoustic wave from being directed to the left side, the reflection electrode 18 is arranged instead of the two neighboring electrode fingers 17 extending from the near-side bus bar 14b. In this example, the reflection electrode 18 is provided between the area corresponding to the second period length $\lambda$ from the left end of the first IDT block 1 and the area corresponding to the fifth period length $\lambda$ from the left end.

In the second IDT block 1, three neighboring electrode fingers 17 extending from the far-side bus bar 14a and a single electrode finger 17 neighboring to the three electrode fingers 17 and extending from the near-side bus bar 14b are repeatedly disposed with a period length $\lambda$ along the acoustic wave propagation direction. In addition, in the second IDT block 1, similar to the first IDT block 1, the reflection electrode 18 is provided instead of the two neighboring electrode fingers 17 and 17 extending from the far-side bus bar 14a as illustrated in FIG. 2. In the second IDT block 1, the reflection electrodes 18 are provided in each of the areas corresponding to the fourth and fifth period lengths $\lambda$ from the left end of the second IDT block 1. In addition, in the second IDT block 1, for example, in the area corresponding to the second period length $\lambda$ from the left end, the electrode finger 17 extending from the far-side bus bar 14a is provided instead of the electrode finger 17 extending from the near-side bus bar 14b. Therefore, the electrode fingers 17 are arranged (weed out) not to excite the acoustic wave in the corresponding area.

Here, comparing the layout of each electrode finger 17 between the first IDT block 1 and the second IDT block 1, the electrode fingers 17 of the first IDT block 1 described above are arranged approximately in symmetry in the forward-backward direction, compared to the second IDT block 1. That is, three neighboring electrode fingers 17 extending from any one of the pair of bus bars 14 are connected to the near-side bus bar 14b in the first IDT block 1 and are connected to the far-side bus bar 14a in the second IDT block 1. Accordingly, as seen from a plan view, each of the three electrode fingers 17 is connected to one of the bus bars 14 in the ground port 23 side of each of the IDT blocks 1 and 1, and the electrode finger 17 extending to the one of the bus bars 14 is connected to the other bus bar 14 opposite to the one of the bus bars 14.

In this case, in the area between the first and second IDT blocks 1 and 1, the length (the interval between the IDT blocks 1 and 1) L of this area is set such that the period length $\lambda$ is repeated across the IDT blocks 1 and 1, that is, such that interruption of the period length 2 in the corresponding area is prevented, and undesired excitation of the acoustic wave is suppressed between the IDT blocks 1 and 1. Hereinafter, the reason why the input-side IDT electrodes 12 are structured in this manner will be described by exemplifying the period length $\lambda a$ ($\lambda 1 < \lambda a < \lambda 2$) between the bus bars 14a and 14b and sequentially providing description from the basic DART structure.

Figure 3A:
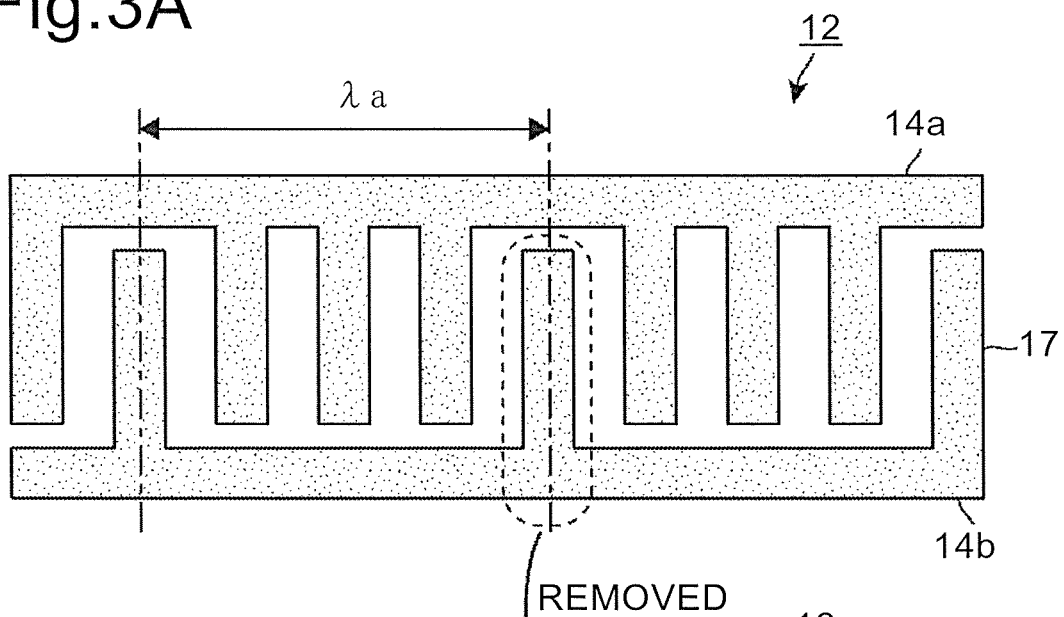
FIGS. 3A and 3B are top plan views illustrating an original structure of the input-side IDT electrode.

FIG. 3A illustrates the input-side IDT electrode 12 with the period length $\lambda a$ described above in the basic DART structure. Specifically, a structure including three neighboring electrode fingers 17 extending from the far-side bus bar 14a and a single electrode finger 17 neighboring to the three electrode fingers 17 and extending from the near-side bus bar 14b is disposed in order along the acoustic wave propagation direction. In FIG. 3A, the input-side IDT electrode 12 is illustrated in simplification. Note that this configuration will be similarly applied to FIGS. 3B to 5 described below.

Next, in order to adjust the frequency characteristic of the input-side IDT electrode 12 in such a basic DART structure, for example, a layout will be discussed, in which the electrode finger 17 extending from the near-side bus bar 14b in the approximate center of the acoustic wave propagation direction is removed. That is, in order to prevent an acoustic wave from being excited through the electrode finger 17, an electrode finger 17 extending from the far-side bus bar 14a is arranged instead of the electrode finger 17 described above as illustrated in FIG. 3B. Therefore, in the approximate center of the input-side IDT electrode 12, seven neighboring electrode fingers 17 extend from the far-side bus bar 14a.

Figure 4A:
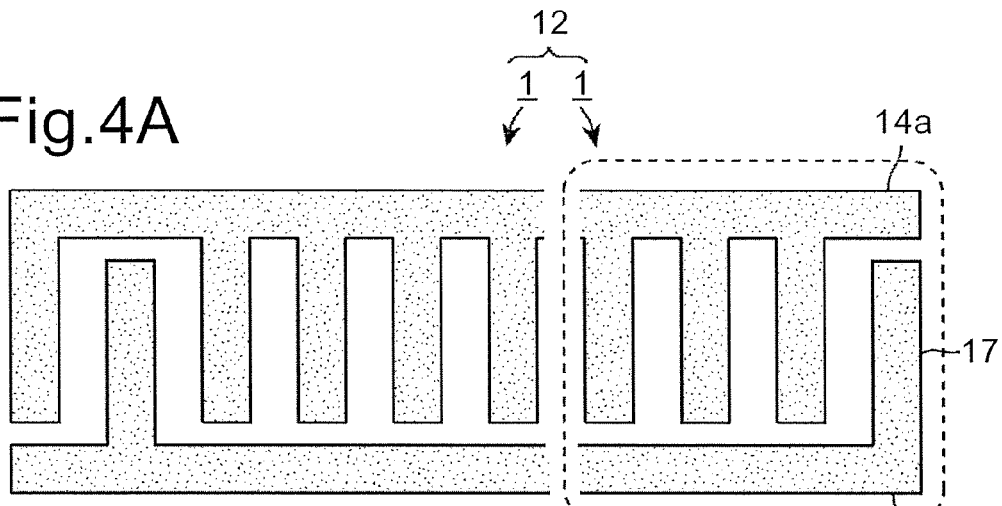
FIGS. 4A to 4C are top plan views illustrating a process of forming the input-side IDT electrode.
Figure 4B:
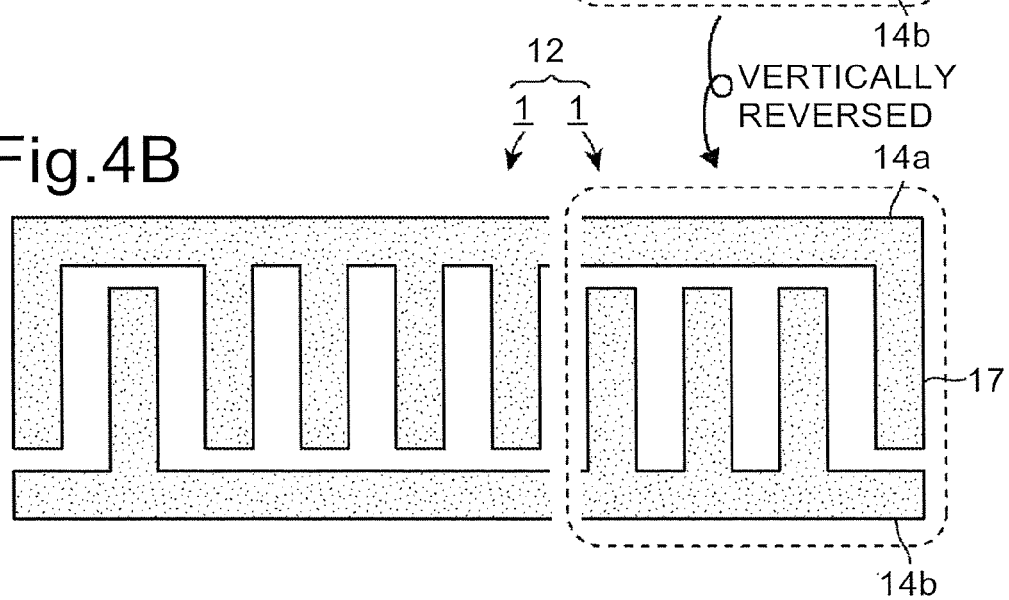

Subsequently, the input-side IDT electrode 12 is folded back in the area where the input-side IDT electrode 12 is provided such that the input-side IDT electrode 12 has a meander structure described above. Specifically, as indicated by the one-dotted chain line in FIG. 4A, the input-side IDT electrode 12, between the third electrode finger 17 from the right side out of the seven neighboring electrode fingers 17 extending from the far-side bus bar 14a and the electrode finger 17 neighboring to the corresponding electrode finger 17 from the left side, is divided into two IDT blocks 1 and 1. In addition, as illustrated in FIG. 4B, compared to the configuration of FIG. 4A, the layout of the electrode fingers 17 of the first IDT block 1 in the right side is symmetrical in the forward-backward direction. That is, in FIG. 4A, the electrode finger 17 extending from the near-side bus bar 14b and the electrode finger 17 extending from the far-side bus bar 14a are not connected to the near-side bus bar 14b and the far-side bus bar 14a, respectively, but connected to the far-side bus bar 14a and the near-side bus bar 14b, respectively. Note that, in order to easily see each IDT block 1 and 1, the first IDT block 1 and the second IDT block 1 are separately and schematically illustrated in FIGS. 4A and 4B.

Figure 4C:
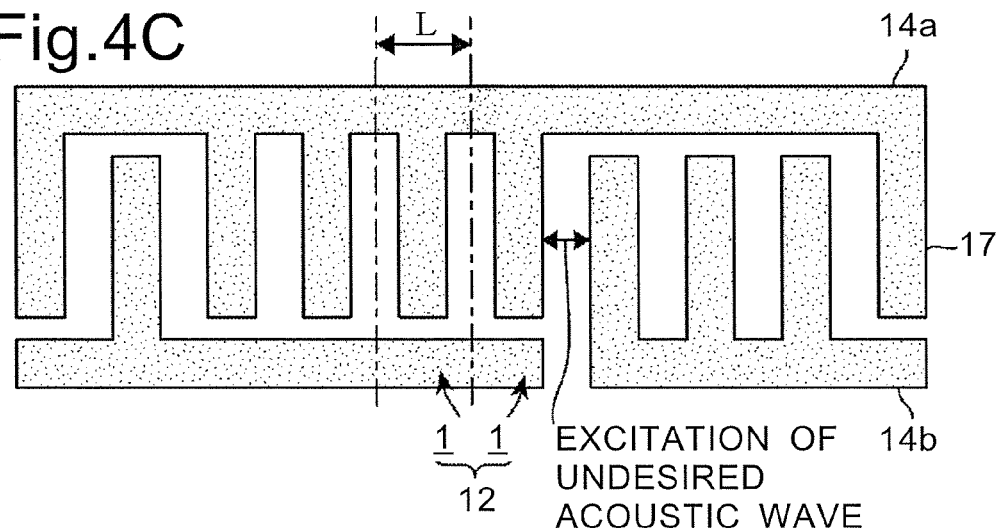

As illustrated in FIG. 4C, the IDT blocks 1 and 1 are arranged such that the period length $\lambda a$ is repeated continuously between the IDT blocks 1 and 1, that is, such that the interval between the IDT blocks 1 and 1 is equal to the interval between the electrode fingers 17 and 17 in other areas. In addition, each of the bus bars 14a and 14b is arranged between the input port 21 and the ground port 23 such that the IDT blocks 1 and 1 have the meander structure described above. Specifically, between the IDT blocks 1 and 1, the far-side bus bars 14a and 14a are connected to each other, and the near-side bus bars 14b and 14b are separated without making contact with each other. Note that, assuming that the three neighboring electrode fingers 17 are sequentially referred to as first, second, and third electrode fingers from the left side, in this specification, the "interval L" refers to a dimension between a center position between the first and second electrode fingers 17 and a center position between the second and third electrode fingers 17 as illustrated in FIG. 4C.

Figure 3B:
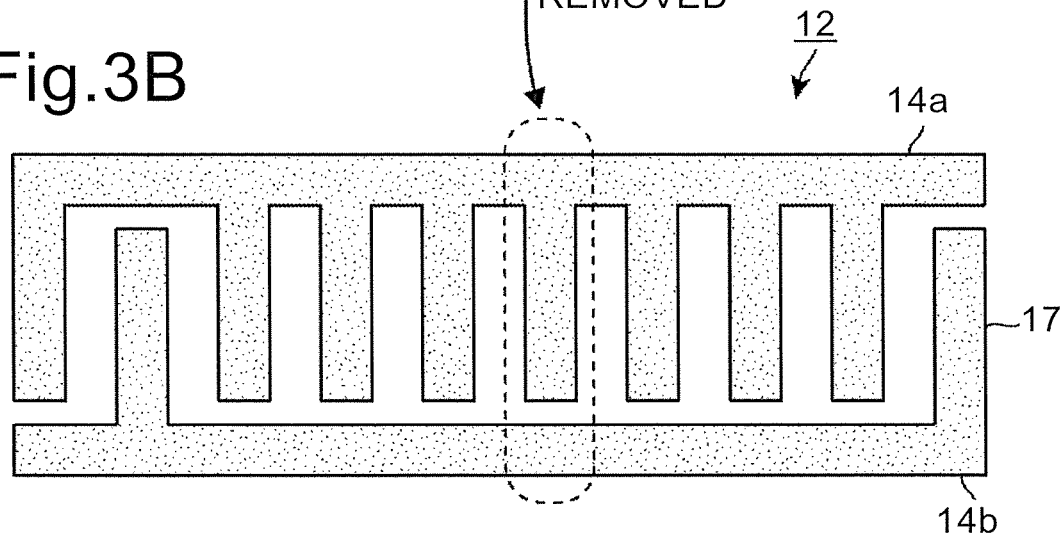

In this case, as recognized from FIGS. 3B and 4C described above, since the input-side IDT electrodes 12 are arranged in a meander structure, in the area between the IDT blocks 1 and 1, the electrode finger 17 extending from the far-side bus bar 14a of the second IDT block 1 mutually neighbors to the electrode finger 17 extending from the near-side bus bar 14b of the first IDT block 1. For this reason, in the input-side IDT electrode 12, it can be said that an undesired acoustic wave is unintentionally excited due to the meander structure, compared to the original design (FIG. 3B). On the contrary, according to the present invention, in order to suppress such an undesired acoustic wave, the electrode fingers 17 are arranged as follows.

Figure 5:
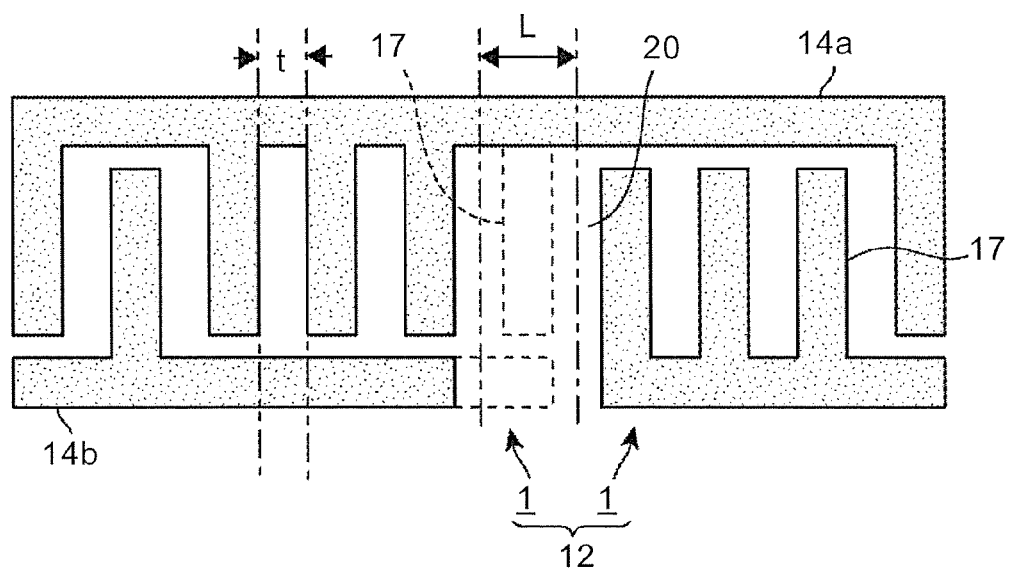
FIG. 5 is a top plan view illustrating a period length λa of the input-side IDT electrode.

Specifically, as illustrated in FIG. 5, the electrode finger 17 in the first IDT block 1 side is removed from the second IDT block 1. In other words, a space area (area having no electrode) 20 is provided instead of the electrode finger 17 so that an acoustic wave is not excited between the corresponding electrode finger 17 and the electrode finger 17 of the first IDT block 1. Therefore, between the first and second IDT blocks 1 and 1, the electrode finger 17 contributing to excitation of an undesired acoustic wave is removed while the period length λa is maintained, that is, without overlapping or separating the period length λa. Since this electrode finger 17 is originally arranged not to excite the acoustic wave as recognized from FIG. 3B described above, there is no problem in the characteristic even when the electrode finger 17 is removed.

In this case, in the area between the IDT blocks 1 and 1, a phase of the acoustic wave may be deviated in some cases if the electrode finger 17 is removed. That is, an acoustic wave propagation velocity in the area where the electrode finger 17 and the like are formed differs from that in the area where the electrode finger 17 is not formed (for example, the area between the electrode fingers 17 and 17). Therefore, the period length λa of the acoustic wave in the area between the IDT blocks 1 and 1 may be slightly deviated by removing the electrode finger 17 in some case. In this regard, according to the present invention, in order to suppress a phase deviation in the acoustic wave generated by removing the electrode finger 17 between the IDT blocks 1 and 1, the interval L described above is set to a dimension different from that corresponding to the period length λa. Specifically, in a case where the piezoelectric substrate 11 and the input-side IDT electrode 12 are made of lithium niobate and aluminum, respectively, and the input-side IDT electrode 12 has a thickness of 0.345 μm, the interval L described above is set to 2.637 μm (period length λa×2/8×1.0433) when the period length λa is, for example, set to 10.11 μm.

Here, description will be made in detail for a method of adjusting the interval L. First, the interval L will be described again with reference to FIG. 5. Assuming that the area between the neighboring electrode fingers 17 and 17 in the area where the electrode fingers 17 are arranged side by side (the area where the electrode finger 17 is not removed) has a width t, the interval L is a dimension between a position separated by t/2 to the left side from the left end of the electrode finger 17 in the left end of the first (right) IDT block 1, and a position separated by t/2 to the right side from the right end of the electrode finger 17 in the right end of the second (left) IDT block 1.

The interval L is expressed as 2/8 λa (=1/4 λa) in terms of the period length λa described above. In this case, the interval obtained after the interval L is adjusted based on a fact that the electrode finger 17 between the IDT blocks 1 and 1 is removed is denoted by L'. Hereinafter, the interval L' will be described. That is, the phase difference dφ generated when the electrode finger 17 is removed can be expressed as follows:

$$d\phi = \{kf - (kf + k11)\} \times \lambda a / 4$$

$$= -k11' \times 2\pi / \lambda a \times \lambda a / 4$$

$$= -\pi / 2 \times k11'$$

where kf denotes a wave number in a free surface (in the area having no IDT electrode 12), and k11' denotes a normalized wave number determined based on a material of the piezoelectric substrate 11, a structure of the electrode finger 17, a material of the IDT electrode 12, a film thickness of the IDT electrode 12, and the period length λa (k11 (wave number)=k11'×2π/λa).

In order to remove or attenuate the phase difference dφ, it is necessary to increase the interval L' by the phase difference dφ, compared to the original interval L. In this case, the interval L' can be expressed as follows:

$$L' = L + d\phi / 2\pi \times \lambda a$$

$$= \lambda a / 4 + d\phi / 2\pi \times \lambda a$$

$$= \lambda a / 4 \times (1 + k11').$$

If (1+k11')=α, the interval L' can be expressed as follows:

$$L'=1/4\lambda a\alpha.$$

Figure 7:
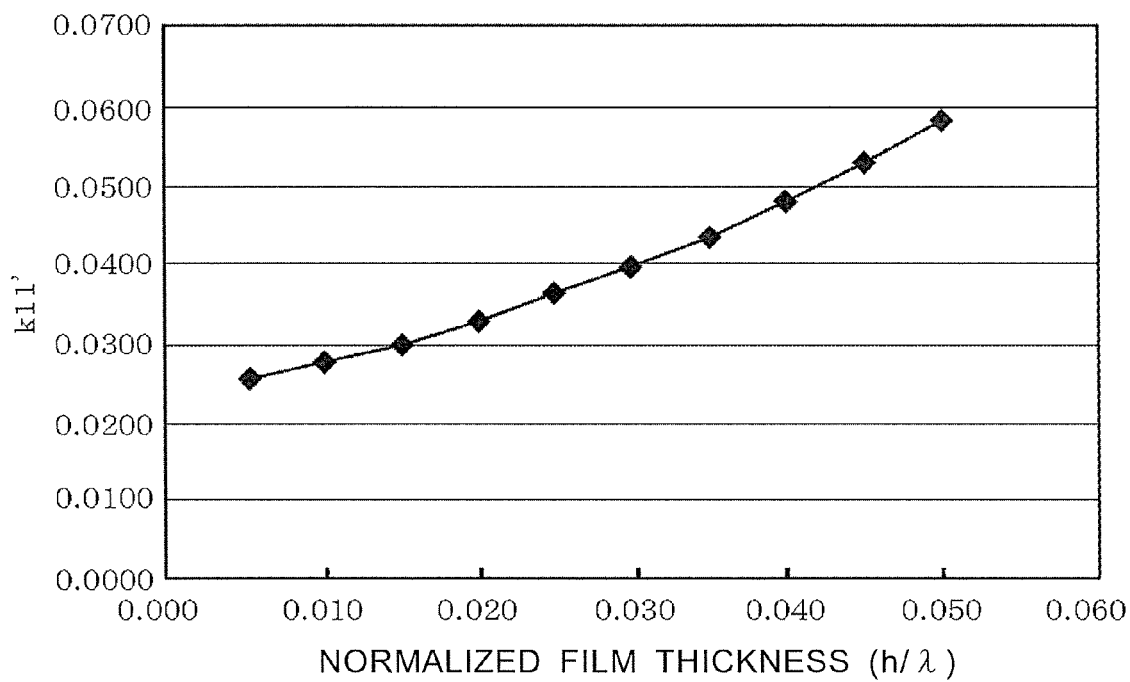
FIG. 7 is a characteristic diagram for describing an interval between the IDT blocks.

FIG. 7 illustrates a result of the experiment made for dependence of the normalized wave number k11' on the film thickness of the electrode film in a case where the piezoelectric substrate 11 is made of lithium niobate, the electrode fingers 17 are arranged in a DART structure (having no reflection electrode 18), and the IDT electrode 12 is made of aluminum. The abscissa of FIG. 7 denotes a normalized film thickness (h/λ) as a value obtained by dividing the electrode film thickness h by the period length λa. Based on a result of this experiment and a result of the experiment performed by changing parameters such as a material of the piezoelectric substrate 11, it was recognized that the coefficient α becomes 1.0005 to 1.07 (k11'=0.0005 to 0.07) for a use range of a practical filter. Specifically, when the piezoelectric substrate 11 is made of crystal, and the normalized film thickness of the piezoelectric substrate 11 is 0.005, the coefficient α becomes 1.0005.

As described below, in a case where two electrode fingers 17 are removed between the IDT blocks 1 and 1, the interval L' can be expressed based on the aforementioned equation as follows:

$$L'=4/8\lambda a\alpha=1/2\lambda a\alpha.$$

In a case where three electrode fingers 17 are removed, the interval L' can be expressed as follows:

$$L'=6/8\lambda a\alpha=3/4\lambda a\alpha.$$

Therefore, the interval L' in the DART structure is individually set depending on the number of the removed electrode fingers 17. In addition, since the interval L' depends on the period length λa, the interval L' is set depending on each period length λ in a case where the IDT electrodes 12 (13) are arranged in a tapered shape as illustrated in FIG. 1 and the like described above.

Figure 6:
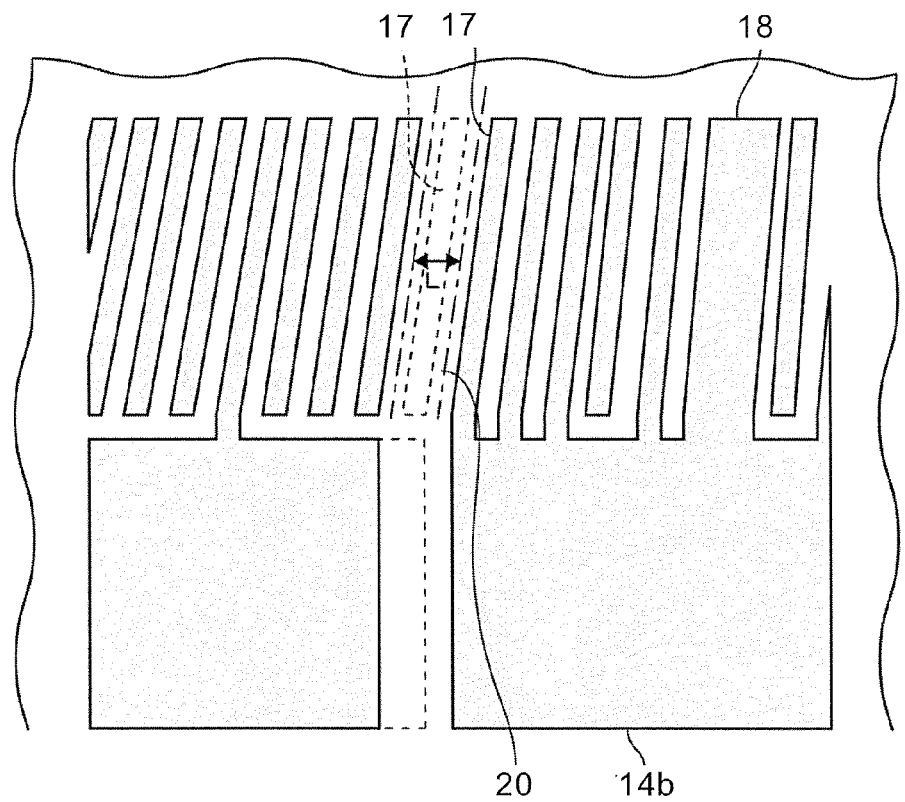
FIG. 6 is an enlarged plan view illustrating a part of the input-side IDT electrode.

If the input-side IDT electrode 12 is configured such that the arrangement area of each electrode finger 17 has a tapered shape as described above, the electrode finger 17 of the second IDT block 1 neighboring to the first IDT block 1 is removed as described above, and the interval L is adjusted for each period length λ1 to λ2 (the interval L is individually adjusted for each period length λ1 to λ2), the input-side IDT electrode 12 is configured as illustrated in FIG. 2 or FIG. 6 described above. Accordingly, it is possible to prevent an undesired acoustic wave from being excited across the period lengths λ1 to λ2 and suppress a phase deviation in the acoustic wave.

Subsequently, the output-side IDT electrode 13 will be described with reference to FIG. 8. The output-side IDT electrode 13 includes three IDT blocks 1 connected in series between the output port 22 and the ground port 23. That is, if the three IDT blocks 1 are sequentially referred to as first, second, and third IDT blocks from the right side to the left side, the output port 22 is connected to the far-side bus bar 14a of the first IDT block 1. The near-side bus bar 14b of the first IDT block 1 is connected to the near-side bus bar 14b of the second IDT block 1, and the far-side bus bar 14a of the second IDT block 1 is connected to the far-side bus bar 14a of the third IDT block 1. The ground port 23 is connected to the near-side bus bar 14b of the third IDT block 1. The three IDT blocks 1 are arranged side by side to neighbor to each other along the acoustic wave propagation direction. In this example, the ground port 23 serves as a first signal port, and the output port 22 serves as a second signal port.

In the first IDT block 1 of the output-side IDT electrode 13, three electrode fingers 17 extend from the near-side bus bar 14a to neighbor to each other. A single electrode finger 17 neighboring to the three electrode fingers 17 is connected to the far-side bus bar 14b. In the second IDT block 1, the three electrode fingers 17 are connected to the far-side bus bar 14b. In the third IDT block 1, the three electrode fingers 17 are connected to the near-side bus bar 14a. As a result, in each IDT block 1 of the output-side IDT electrode 13, three neighboring electrode fingers 17 extending from one of the bus bars 14 out of four electrode fingers 17 included in the period length 2 are connected to the bus bar 14 of the ground port 23 side as seen in a plan view.

Figure 8:
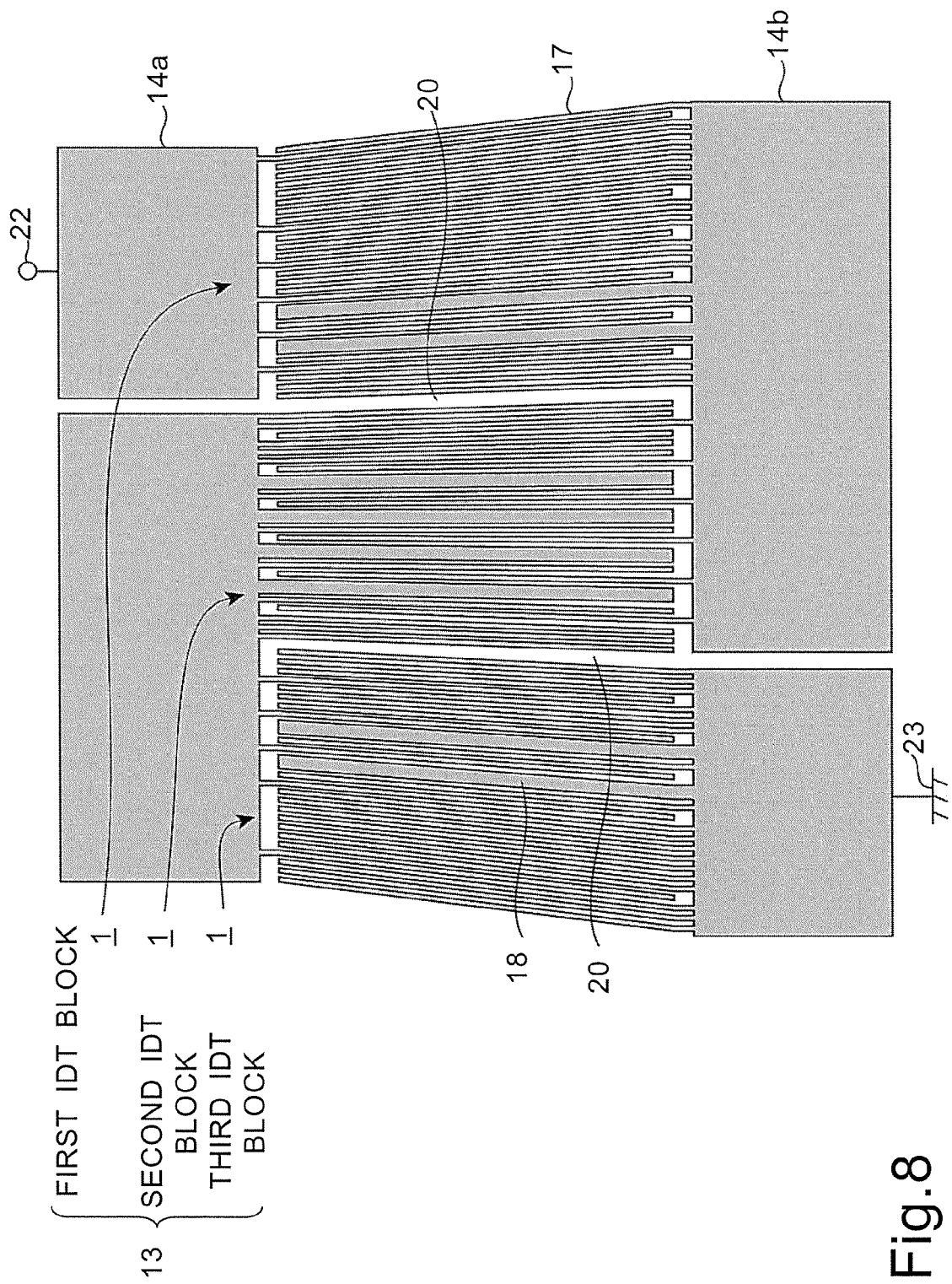
FIG. 8 is a top plan view illustrating an output-side IDT electrode of the acoustic wave filter.

Similar to the input-side IDT electrode 12, in the output-side IDT electrode 13, the reflection electrode 18 is provided, or the electrode finger 17 is removed as illustrated in FIG. 8. In addition, between the neighboring IDT blocks 1 and 1, the electrode finger 17 is removed, and the interval L is adjusted respectively as described above. Hereinafter, the layout of the electrode fingers 17 between the IDT blocks 1 and 1 of the output-side IDT electrode 13 will be described in brief.

In the area between the first and second IDT blocks 1 and 1, two electrode fingers 17 of the second IDT block 1 located in the first IDT block 1 side are removed, compared to the layout of FIG. 5 described above. In addition, in the area between the second IDT block 1 and the third IDT block 1, the layout is reversed in the forward-backward direction, compared to the layout of FIG. 5. In addition, similar to the input-side IDT electrode 12, the interval L between the neighboring IDT blocks 1 and 1 is adjusted respectively.

If an electric signal is input to the input port 21 of the SAW filter arranged as described above, an acoustic wave is generated in the area between the electrode finger 17 extending from the far-side bus bar 14a and the electrode finger 17 extending from the near-side bus bar 14b in the input-side IDT electrode 12. In this case, since the electrode finger 17 in the right end of the second IDT block 1 of the input-side IDT electrode 12 is removed, generation of an undesired acoustic wave is suppressed between the corresponding electrode finger 17 and the first IDT block 1.

Meanwhile, even when the electrode finger 17 in the right end of the second IDT block 1 is removed, the electrode finger 17 extending from the far-side bus bar 14a in the left side of the removed electrode finger 17 and the electrode finger 17 extending from the near-side bus bar 14b in the left end of the first IDT block 1 still neighbor to each other by interposing the area where the removed electrode finger 17 has been formed between the IDT blocks 1 and 1. Accordingly, an acoustic wave is excited in the area between these electrode fingers 17 and 17. However, since these electrode fingers 17 and 17 are separated from each other with a larger gap, compared to those of the electrode fingers 17 and 17 in other areas (specifically, twice or larger), excitation of an undesired acoustic wave is suppressed. Therefore, in the input-side IDT electrode 12 according to the present invention, the electric field intensity formed between the neighboring IDT blocks 1 and 1 is reduced, compared to the configuration of FIG. 4C described above (in which the electrode finger 17 is not removed). Therefore, it is possible to suppress excitation of an undesired acoustic wave between the IDT blocks 1 and 1.

Since the interval L between these IDT blocks 1 and 1 is adjusted as described above, the acoustic wave reaches the output-side IDT electrode 13 while a phase deviation is not generated in the acoustic wave, or generation of a phase deviation is suppressed between the IDT blocks 1 and 1. Therefore, it is possible to suppress, for example, generation of energy loss of an acoustic wave (insertion loss of the filter).

In the output-side IDT electrode 13, between the electrode finger 17 extending from the far-side bus bar 14a and the electrode finger 17 extending from the near-side bus bar 14b, an acoustic wave is converted into an electric signal, which is extracted from the output port 22. Since the electrode finger 17 between the neighboring IDT blocks 1 and 1 is removed also from the output-side IDT electrode 13, it is possible to suppress an undesired acoustic wave from being converted into an electric signal. Likewise, since the interval L between the neighboring IDT blocks 1 and 1 of the output-side IDT electrode 13 is adjusted, it is possible to suppress a phase deviation in the acoustic wave.

Figure 9:
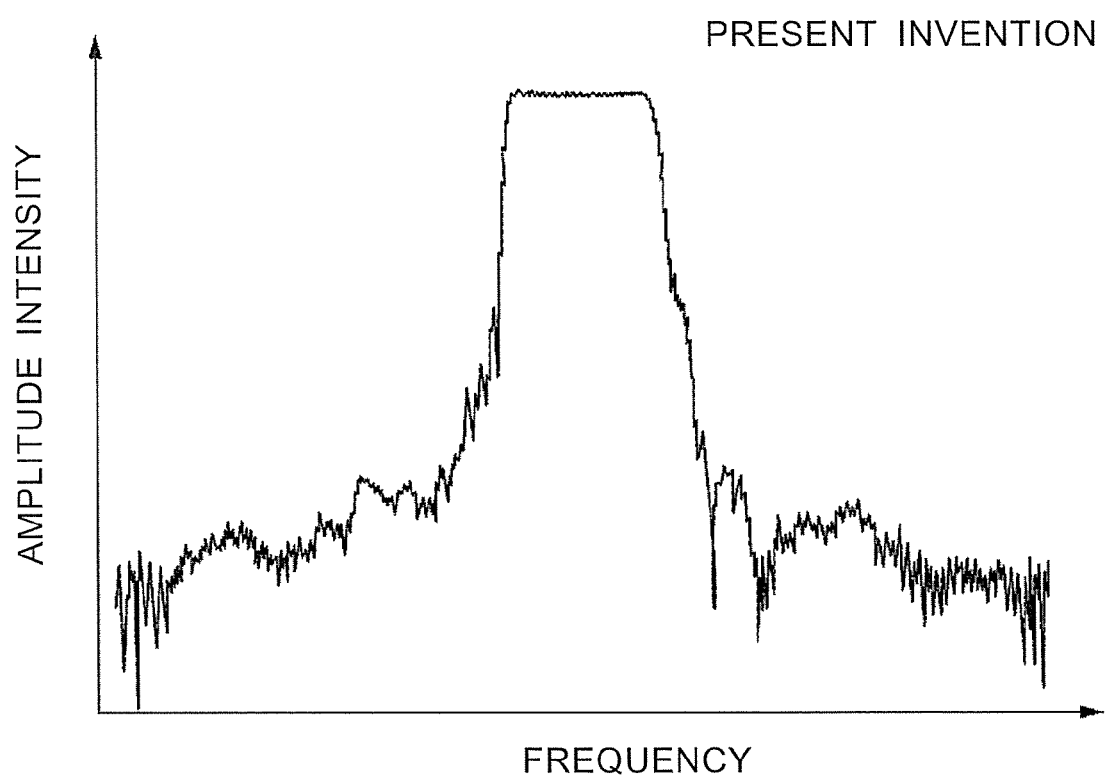
FIG. 9 is a characteristic view illustrating a characteristic obtained in the acoustic wave filter.
Figure 10:
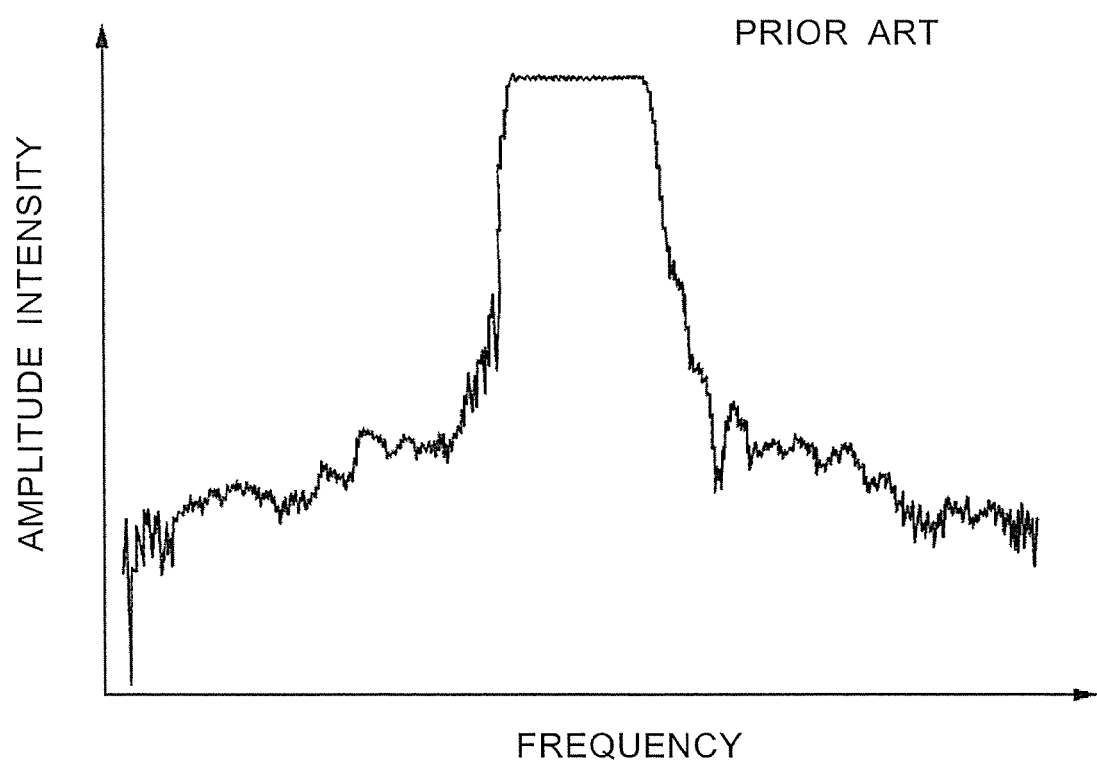
FIG. 10 is a characteristic view illustrating a characteristic obtained in an acoustic wave filter in the prior art.
Figure 11:
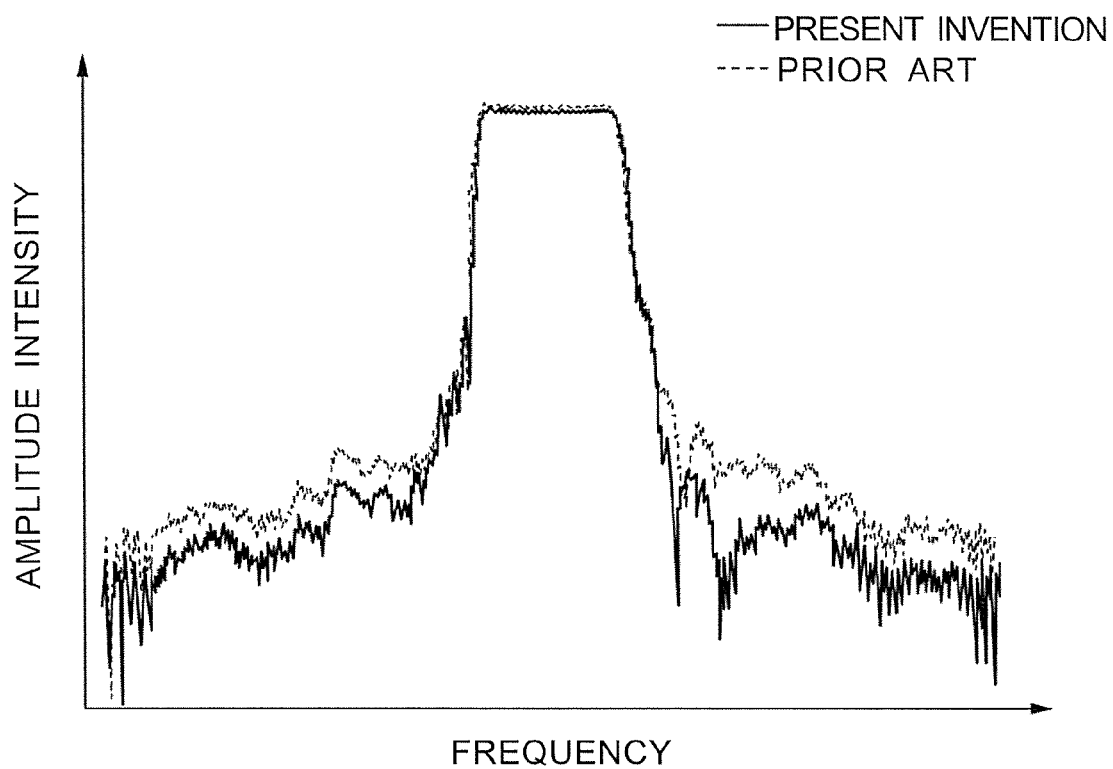
FIG. 11 is a characteristic view illustrating characteristics of the acoustic wave filter according to the present invention and the acoustic wave filter in the prior art.

FIG. 9 illustrates a frequency characteristic obtained from a configuration in which three IDT blocks 1 are arranged in any one of the input-side IDT electrode 12 and the output-side IDT electrode 13 in the filter according to the present invention, and the electrode finger 17 is removed from each area between the IDT blocks 1 and 1. FIG. 10 illustrates a frequency characteristic obtained from a filter of the prior art. FIG. 11 is a graph obtained by overlapping both frequency characteristics of FIGS. 9 and 10. From these characteristics, it is recognized that, according to the present invention, it is possible to suppress the transfer response characteristic from deviating from a design value and obtain an excellent attenuation characteristic in the attenuation band by suppressing undesired excitation other than the excitation necessary to obtain a transfer response characteristic designed originally.

According to the embodiment described above, excitation of an undesired acoustic wave is suppressed by arranging, as the input-side IDT electrode 12 and the output-side IDT electrode 13, meander-structure electrodes in which a plurality of IDT blocks 1 are connected to each other in series between the input port 21 or the output port 22 and the ground port 23 and removing the electrode finger 17 between the neighboring IDT blocks 1 and 1. Accordingly, it is possible to suppress deterioration of the transfer response characteristic and obtain an excellent attenuation characteristic in the attenuation band.

In addition, when the electrode finger 17 is removed from the area between the neighboring IDT blocks 1 and 1, a dimension of the corresponding area (interval L) is adjusted in order to remove or suppress a phase deviation in the acoustic wave in the area between the IDT blocks 1 and 1. Accordingly, it is possible to suppress, for example, generation of energy loss (insertion loss of the filter) of an acoustic wave while the period length λ is maintained from the viewpoint of an acoustic wave.

In addition, when the electrode finger 17 in the right end of the second IDT block 1 is removed from the input-side IDT electrode 12, three electrode fingers 17 extending from the far-side bus bar 14a are arranged (remain) in the first IDT block 1 side relative to the electrode finger 17 extending from the near-side bus bar 14b in the right-side area of the second IDT block 1. For this reason, it is possible to suppress an electric field generated through the electrode finger 17 extending from the near-side bus bar 14b from running around to the first IDT block 1 side using the three electrode fingers 17. Therefore, it is possible to suppress excitation of an undesired acoustic wave between the IDT blocks 1 and 1. Similarly, in the output-side IDT electrode 13, in order not to arrange, in an end portion of any other IDT block 1 side, a single electrode finger 17 opposite to the three electrode fingers 17 extending from one of the bus bars 14 out of the four electrode fingers 17 included in the period length λ, the electrode fingers 17 extending from the one of the bus bars 14 are arranged in the IDT block 1 side other than that of the corresponding electrode finger 17. Therefore, also in the output-side IDT electrode 13, it is possible to suppress excitation of an acoustic wave between neighboring IDT blocks 1 and 1.

Figure 12:
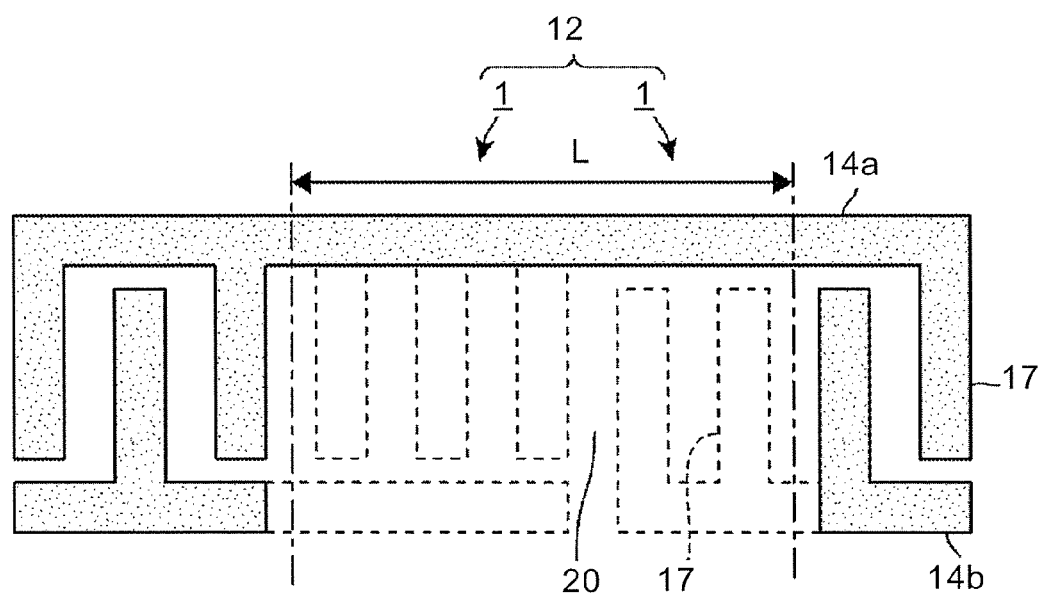
FIG. 12 is a top plan view illustrating another example of the acoustic wave filter.
Figure 13:
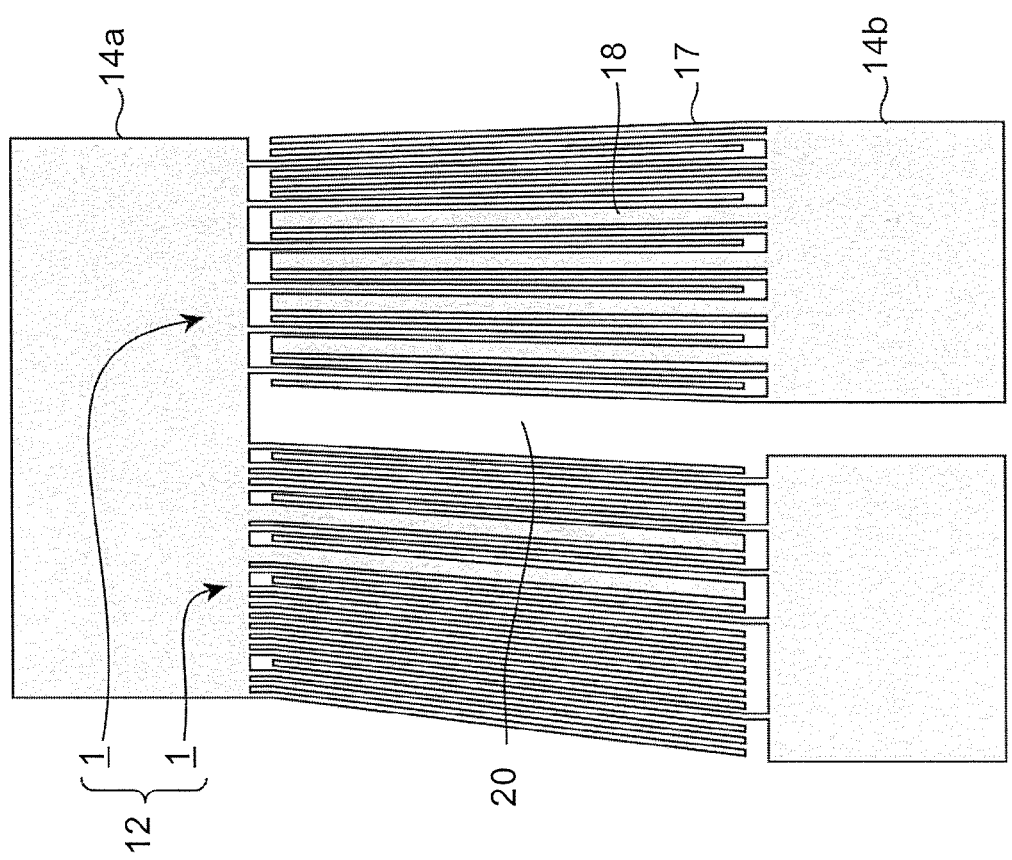
FIG. 13 is a top plan view illustrating another example of the acoustic wave filter.

Hereinafter, another example of the IDT electrodes 12 and 13 according to the present invention will be described for a certain period length λa as in FIG. 5 described above. FIG. 12 illustrates an example of the first IDT block 1 of the input-side IDT electrodes 12, in which two electrode fingers 17 in the second IDT block 1 side are removed. In addition, in the second IDT block 1, the three electrode fingers 17 in the first IDT block 1 side are removed. FIG. 13 illustrates an example in which each electrode finger 17 is arranged in a tapered shape to provide the layout of FIG. 12. In this manner, by removing a plurality of lines of electrode fingers 17 between the neighboring IDT blocks 1 and 1, it is possible to further suppress excitation of an undesired acoustic wave. That is, according to the present invention, the effect can be obtained by removing at least one of the electrode fingers 17 between the neighboring IDT blocks 1 and 1.

Figure 14:
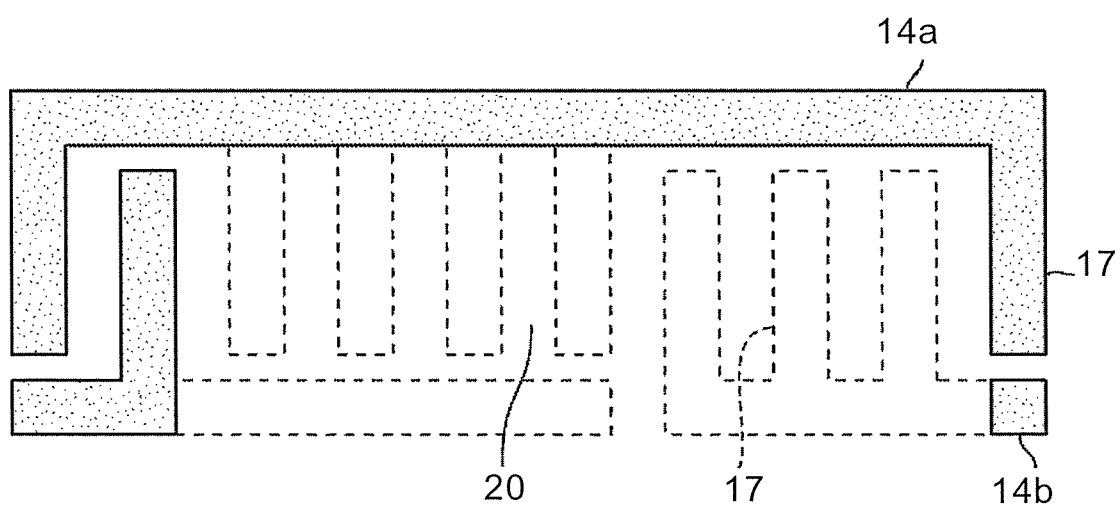
FIG. 14 is a top plan view illustrating another example of the acoustic wave filter.

FIG. 14 illustrates an example in which three electrode fingers 17 in the second IDT block 1 side are removed from the first IDT block 1, and four electrode fingers 17 in the first IDT block 1 side are removed from the second IDT block 1. In this case, in the second IDT block 1, the electrode finger 17 extending from the near-side bus bar 14b out of four electrode fingers 17 included in a period length 2 is arranged in the right-side IDT block 1 side. For this reason, an electric field may leak from this electrode finger 17 to the right-side IDT block 1 in some cases. Therefore, when the electrode finger 17 is removed between the neighboring IDT blocks 1 and 1, at least one of the three neighboring electrode fingers 17 extending from any one of the bus bars 14 out of four electrode fingers 17 included in the period length λ preferably remains in the opposite IDT block 1 side, for example, as illustrated in FIG. 12. Note that the IDT electrodes 12 and 13 having a tapered shape corresponding to FIG. 14 will not be illustrated for brevity purposes, which is similarly applied to the description below. In the following description of other examples, the layout corresponding to FIG. 14 (in which the three neighboring electrode fingers 17 extending from one of the bus bars 14 between the neighboring IDT blocks 1 and 1 are removed) will not be repeatedly described for brevity purposes.

Figure 15A:
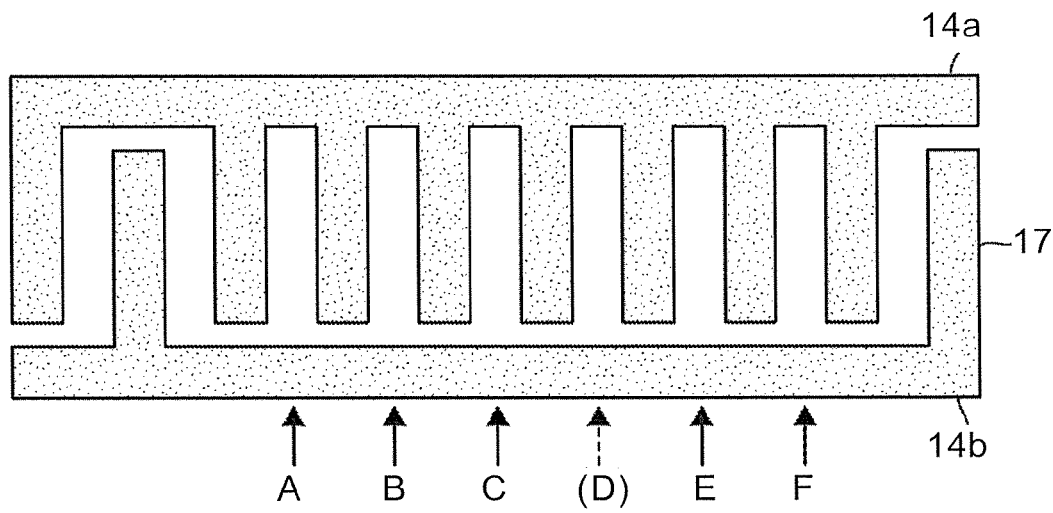
FIGS. 15A to 15C are a top plan views illustrating another example of the acoustic wave filter.

In the example described above, as illustrated in FIG. 4A, the IDT electrode 12 is divided into the IDT blocks 1 and 1 between the third electrode finger 17 from the right side and the electrode finger 17 neighboring to this electrode finger 17 in the left side out of seven neighboring electrode fingers 17 extending from the far-side bus bar 14a. However, the dividing position of the IDT blocks 1 and 1 may be changed as follows. FIG. 15A illustrates the input-side IDT electrode 12 corresponding to FIG. 3B, in which dividable positions of the IDT blocks 1 and 1 are indicated by the reference numerals A to F. Specifically, out of the seven electrode fingers 17, the division of IDT blocks 1 and 1 may be performed for a position A between the first and second electrode fingers from the left side, a position B between the second and third electrode fingers from the left side, a position C between the third and fourth electrode fingers from the left side, a position D between the fourth and fifth electrode fingers from the left side (corresponding to FIG. 4A described above), a position E between the fifth and sixth electrode fingers from the left side, and a position F between the sixth and seventh electrode fingers from the left side. Hereinafter, a layout of the IDT blocks 1 and 1 having a meander structure will be described along with the positions A to F described above. In the drawings, the electrode fingers 17 that can be removed between the neighboring IDT blocks 1 and 1 are hatched.

Figure 15B:
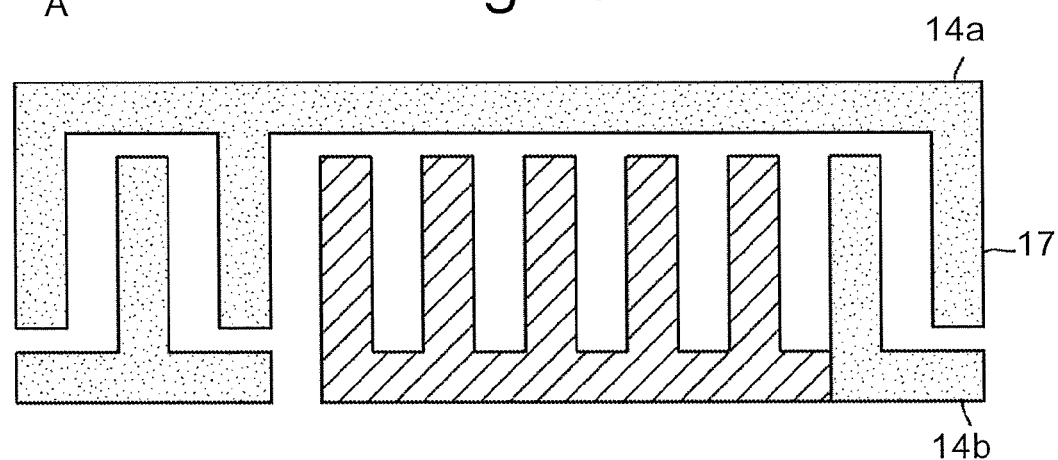
Figure 15C:
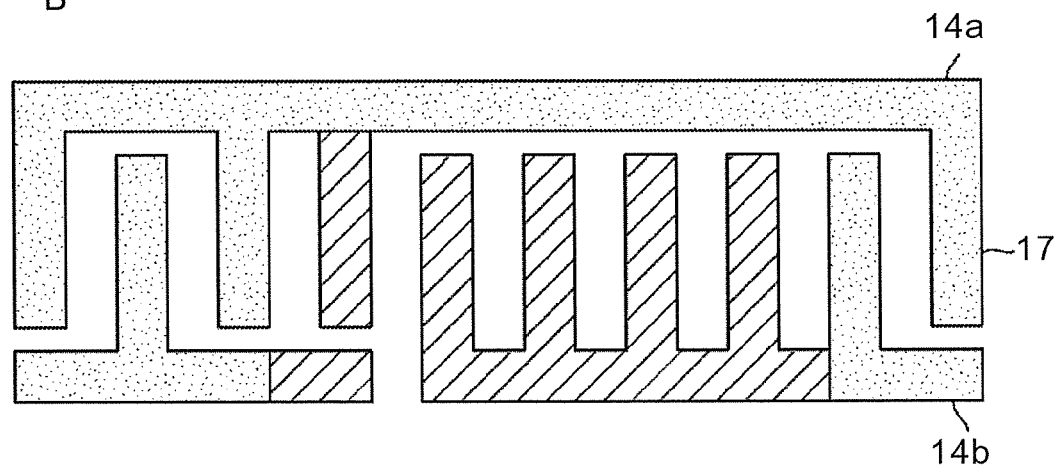
Figure 16A:
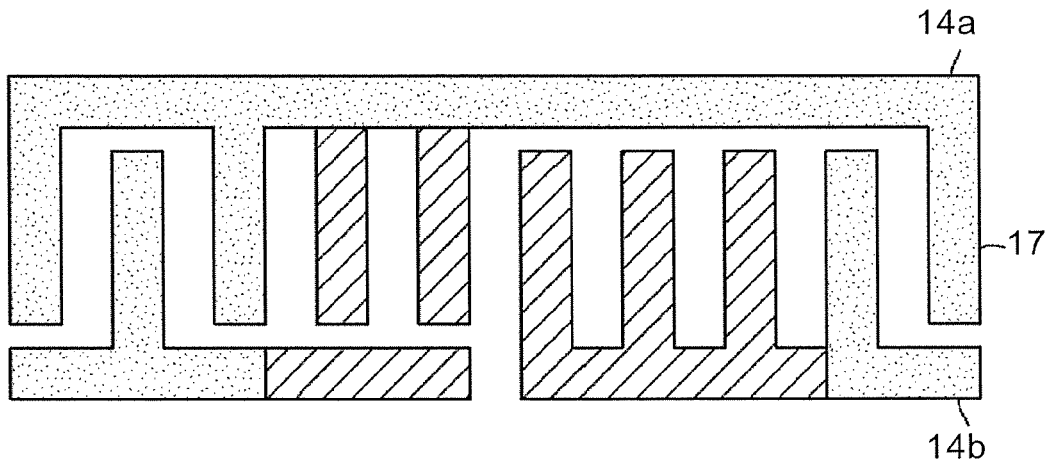
FIGS. 16A to 16C are a top plan views illustrating another example of the acoustic wave filter.
Figure 16B:
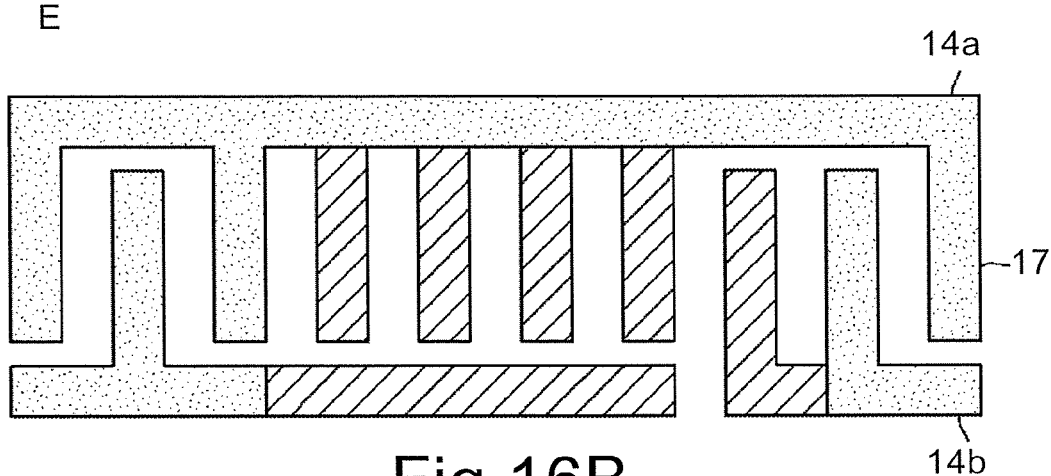
Figure 16C:
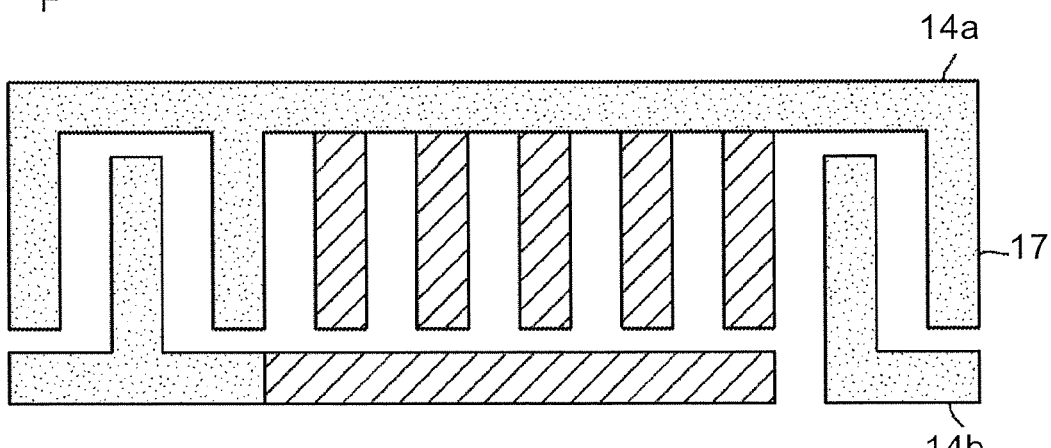

In the case of the position A, five electrode fingers 17 in the left side of the first IDT block 1 may be removed (as illustrated in FIG. 15B). In the case of the position B, four electrode fingers 17 in the left side of the first IDT block 1 and a single electrode finger 17 in the right side of the second IDT block 1 may be removed (as illustrated in FIG. 15C). In the case of the position C, three electrode fingers 17 in the left side of the first IDT block 1 and two electrode fingers 17 in the right side of the second IDT block 1 may be removed (as illustrated in FIG. 16A). In the case of the position E, a single electrode finger 17 in the left side of the first IDT block 1 and four electrode fingers 17 in the right side of the second IDT block 1 may be removed (as illustrated in FIG. 16B). In the case of the position F, five electrode fingers 17 in the right side of the second IDT block 1 may be removed (as illustrated in FIG. 16C).

Figure 17A:
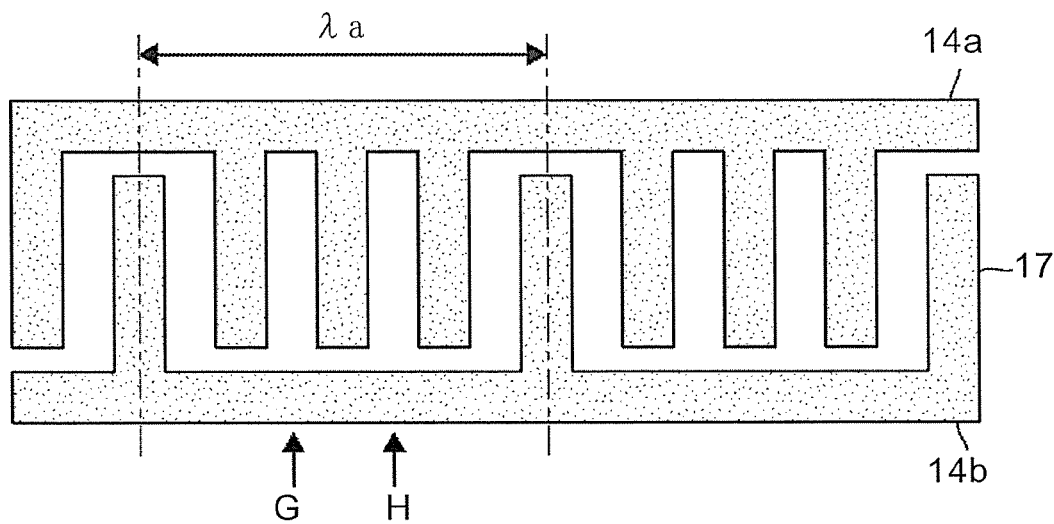
FIGS. 17A to 17C are a top plan views illustrating another example of the acoustic wave filter.
Figure 17B:
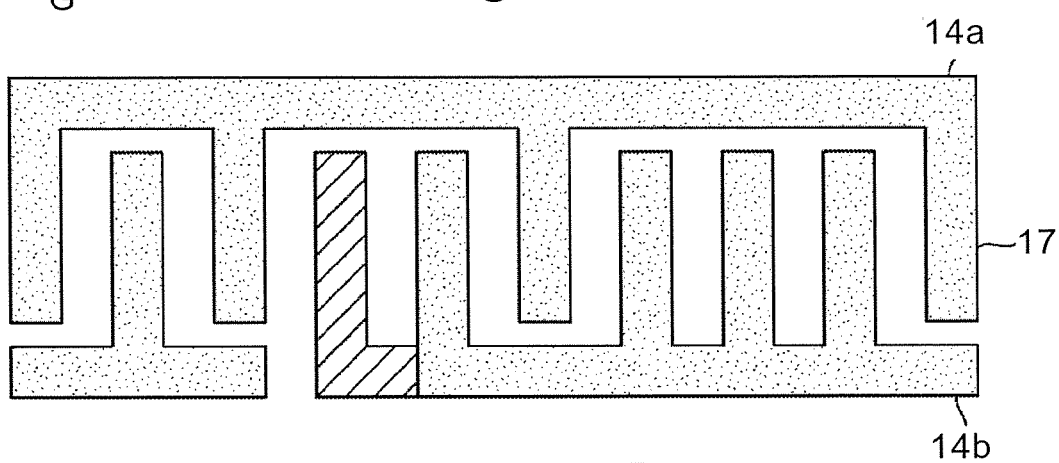
Figure 17C:
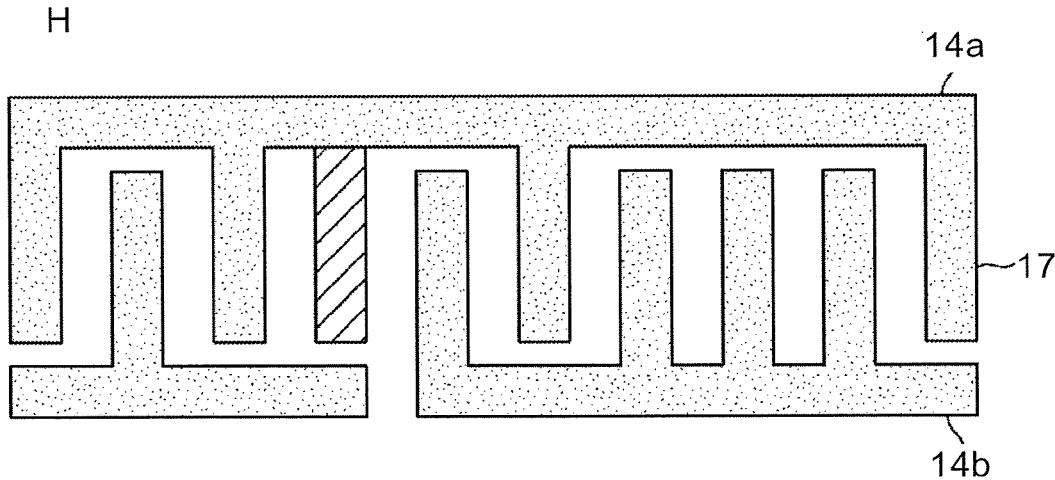

Although description has been made hereinbefore for an example in which the IDT blocks 1 and 1 are divided in the area where the electrode finger(s) 17 is removed as illustrated in FIG. 3B, the IDT blocks 1 may be provided in the basic DART structure of FIG. 3A, and the electrode finger 17 may be removed between the neighboring IDT blocks 1 and 1. That is, as illustrated in the layout of FIG. 17A compared to the FIG. 3A, the IDT blocks 1 and 1 may be divided in the position G between the left electrode finger 17 and the second electrode finger 17 from the left side and the position H between the second electrode finger 17 from the left side and the third electrode finger 17 from the left side out of three neighboring electrode fingers 17 extending from the far-side bus bar 14a. Specifically, in the case of the position G, the electrode finger 17 in the left end of the first IDT block 1 may be removed as illustrated in FIG. 17B. In addition, in the case of the position H, the electrode finger 17 in the right end of the second IDT block 1 may be removed as illustrated in FIG. 17C.

Figure 18A:
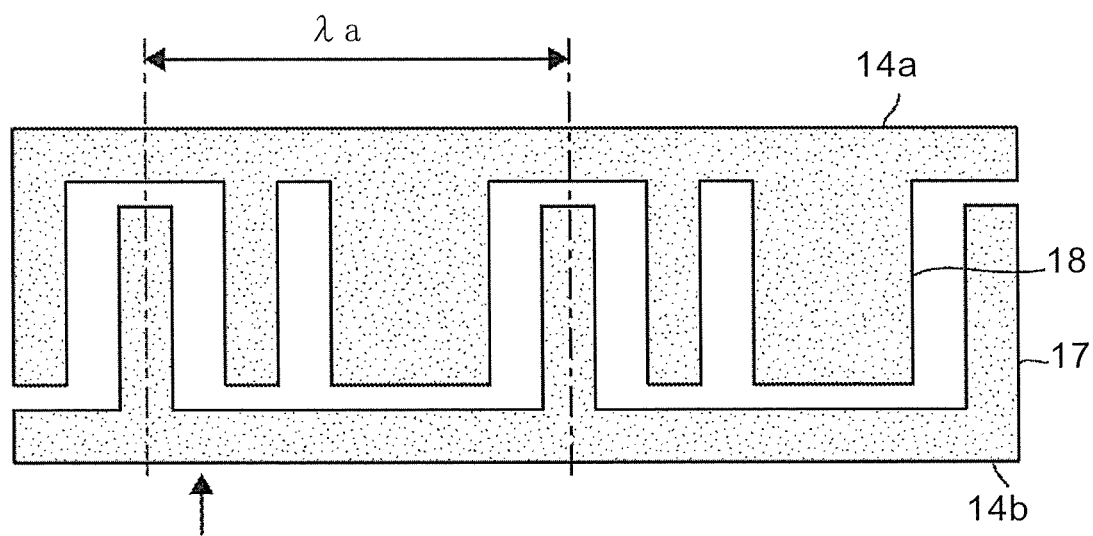
FIGS. 18A to 18B are a top plan views illustrating another example of the acoustic wave filter.
Figure 18B:
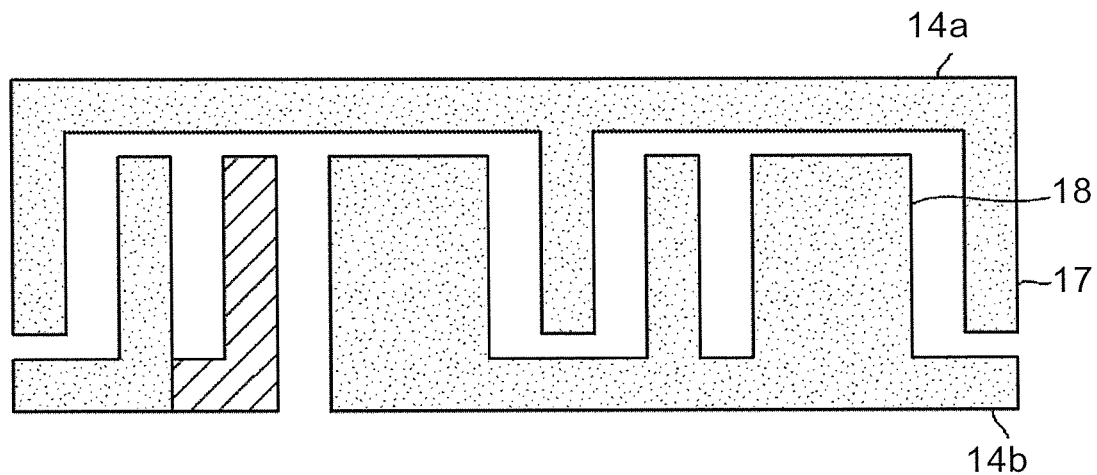

In a case where the reflection electrode 18 is provided instead of the two neighboring electrode fingers 17 extending from the far-side bus bar 14a, the IDT blocks 1 and 1 may be divided between the electrode finger 17 extending from the bus bar 18a and the electrode finger 17 neighboring to this electrode finger 17 and extending from the bus bar 18b as indicated by the arrow in FIG. 18A. In this case, in the second IDT block 1, the electrode finger 17 in the first IDT block 1 side (right side) out of two neighboring electrode fingers 17 extending from the bus bar 18b may be removed as illustrated in FIG. 18B. Therefore, according to the present invention, when a meander structure is employed by folding back the IDT electrodes 12(13), in a case where an acoustic wave is generated while the electrode fingers 17 and 17 intersect each other in the area between the neighboring IDT blocks 1 and 1, the effect described above may be obtained by removing one or more electrode fingers 17 in at least one of the left and right sides in this area.

Figure 19:
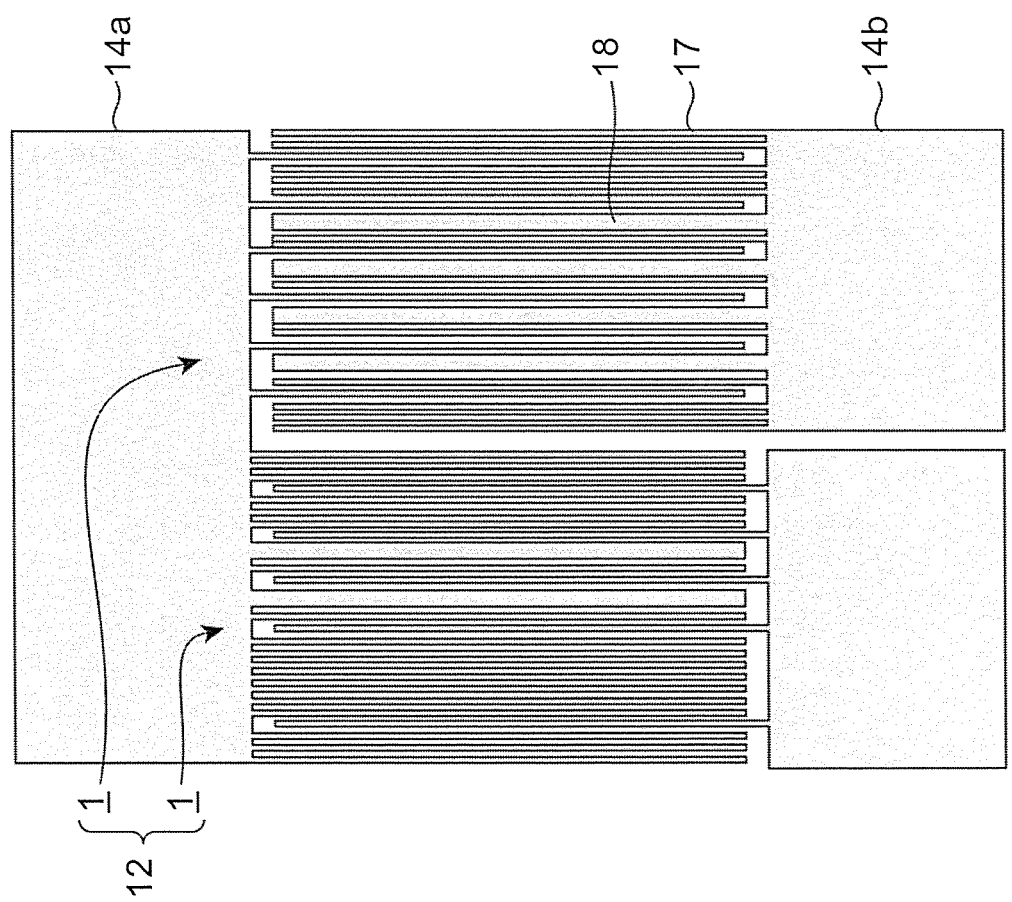
FIG. 19 is a top plan view illustrating another example of the acoustic wave filter.

Although description in each example described above has been made for an example in which the electrode fingers 17 are formed in a tapered shape, the electrode fingers 17 may be arranged to perpendicularly extend from each of the bus bars 14a and 14b as illustrated in FIG. 19. In FIG. 19, the electrode fingers 17 are arranged in the same layout as that of the input-side IDT electrode 12 described above.

Figure 20:
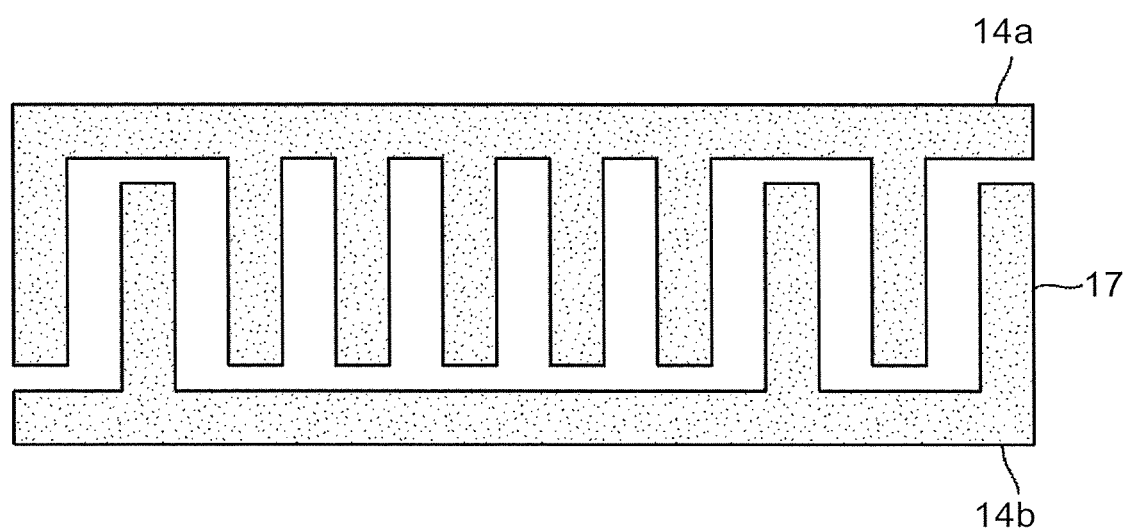
FIG. 20 is a top plan view illustrating another example of the acoustic wave filter.

Furthermore, in two neighboring period units (four electrode fingers 17 included in the period length λa), the electrode finger 17 extending from the bus bar 14b in one of these period units and any one of three electrode fingers 17 extending from the bus bar 14a in the other period unit out of these period units may be exchanged such that the excitation position of the acoustic wave is reversed by 180° between these period units. That is, in the basic DART structure of FIG. 3A, if the third electrode finger 17 from the right end and the fifth electrode finger 17 from the right end are exchanged, the layout of FIG. 20 can be obtained. If the electrode fingers 17 are arranged in this manner, the five electrode fingers 17 in the right side and the five electrode fingers 17 in the left side become horizontally symmetrical in FIG. 20, so that the acoustic wave excitation position is reversed by 180° between the right side and the left side, which is equivalent to the case where the sign of the acoustic wave is reversed. For this reason, even in this layout, the cyclic structure of the electrode fingers 17 in the DART structure is continuously repeated. In the layout of FIG. 20, a plurality of IDT blocks 1 may be arranged as described above, and at least one of the electrode fingers 17 may be removed between the neighboring IDT blocks 1 and 1. Alternatively, the electrode fingers 17 may be removed, and at least one of the electrode fingers 17 between the IDT blocks 1 and 1 may be removed. In addition, in the layout of FIG. 20, the reflection electrode 18 may be arranged.

Similar to the input-side IDT electrode 12 described above, dividing positions between each block 1, or the positions or the number of the electrode fingers 17 to be removed may be set for the output-side IDT electrode 13.

Figure 21:
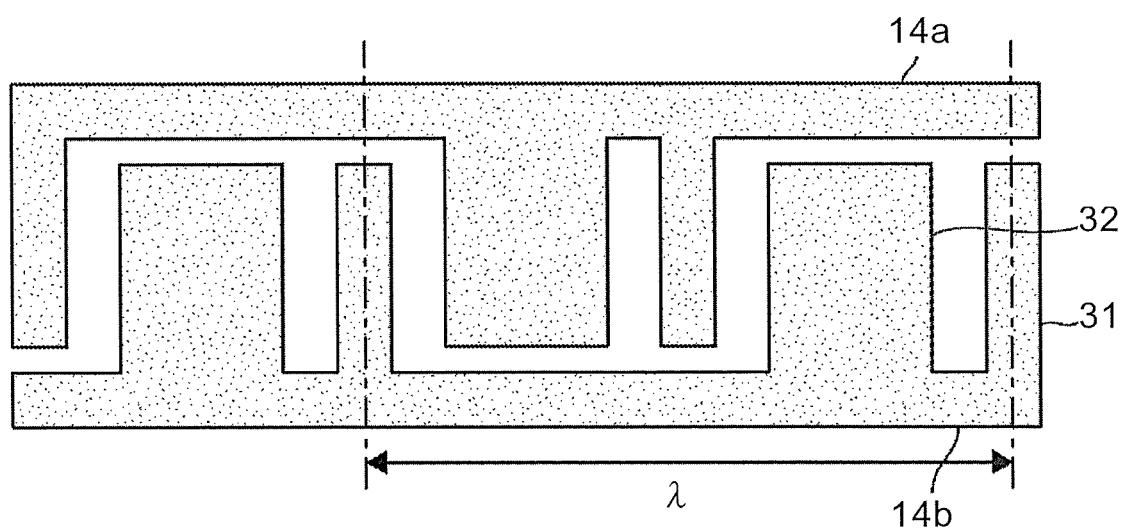
FIG. 21 is a top plan view illustrating another example of the acoustic wave filter.
Figure 22:
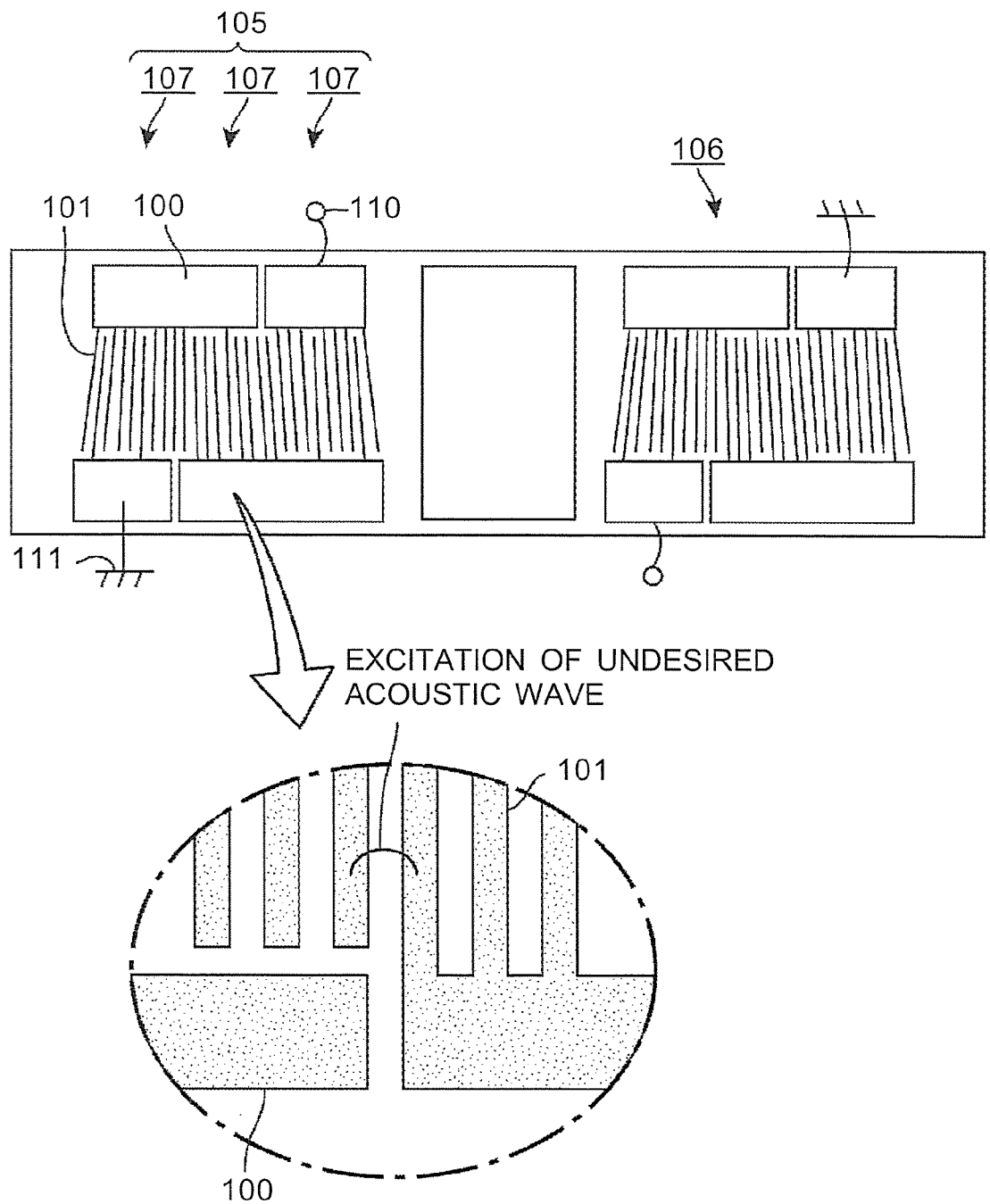
FIG. 22 is a top plan view illustrating an acoustic wave filter in the prior art.

Although two IDT blocks 1 are provided in the input-side IDT electrode 12, and three IDT blocks 1 are provided in the output-side IDT electrode 13 in the example described above, two or more IDT blocks 1 may be provided in each IDT electrodes 12 and 13. In addition, the configuration according to the present invention (the configuration in which the electrode finger 17 between the neighboring IDT blocks 1 and 1 is removed from the meander structure) may be provided in one of the IDT electrodes 12 and 13, and the following configuration may be provided in the other electrode. That is, as the other electrode, an electrode having a typical meander structure in which the electrode finger 17 is not removed but arranged between the neighboring IDT blocks 1 and 1 or an electrode including a single IDT block 1 without employing the meander structure may be used. In addition, as the other electrode, in addition to the DART structure, as illustrated in FIG. 21, for example, an electrode having a period length λ including the electrode finger 31 and the reflection electrode 32 neighboring to each other and extending from the far-side bus bar 14a and the electrode finger 31 and the reflection electrode 32 neighboring to each other and extending from the near-side bus bar 14b such as a different width split finger (DWSF) electrode may be used. Alternatively, a typical bilateral electrode may be used.

In the aforementioned description, the terms, "first," "second," or "third" used to denote each IDT block 1 are given for convenience purposes, and the terms "first signal port" or "second signal port" for each port 21 to 23 are also given for convenience purposes. Therefore, the first and second IDT blocks 1 and 1 (further, the third IDT block 1) may be sequentially arranged from left side to the right side. Alternatively, the connection position between the input or output port 21 or 22 and the ground port 23 may be exchanged.

Furthermore, although description has been made in the aforementioned example for an example in which the IDT electrodes 12 and 13 are provided between the input or output port 21 or 22 and the ground port 23, the IDT electrodes 12 and 13 may be connected to another signal port instead of the ground port 23 so as to provide a balance type filter.

What is claimed is:
1. An acoustic wave filter, comprising:
(a) an input-side IDT electrode and an output-side IDT electrode arranged on a piezoelectric substrate along an acoustic wave propagation direction and separated from each other,
(b) the input-side IDT electrode includes a ground port and an input port serves as an input signal port, and the output-side IDT electrode includes a ground port and an output port serves as an output signal port;
(c) at least one of the input-side IDT electrode and the output-side IDT electrode is configured such that:
(c1) electrode fingers extends from each of a pair of bus bars arranged in parallel with each other to extend along an acoustic wave propagation direction to an opposite bus bar side, so that a plurality of IDT blocks in which a group of electrode fingers are arranged in a comb-tooth shape are arranged side by side along the acoustic wave propagation direction and are connected in series through each of the bus bars;
(c2) among the bus bars located in both ends of a group of the IDT blocks connected to each other in series, the bus bar facing an area between the input-side IDT electrode and the output-side IDT electrode is connected to the ground port, and the bus bar located in an opposite side of the area is connected to one of the signal ports;
(c3) a group of the electrode fingers of each IDT block is configured such that a period unit is cyclically repeated along the acoustic wave propagation direction, said period unit being an overall dimension of three neighboring electrode ringers extending from one of the bus bars and a single electrode finger neighboring to the three electrode fingers and extending from the other bus bar out of the pair of the bus bars of each IDT block,
(c4) an interval between the neighboring IDT blocks is set such that the period unit is cyclically repeated in the IDT electrode;
(c5) a space area is formed between the neighboring IDT blocks, and the space area is corresponding to one or more electrode fingers arranged side by side of the electrode fingers arranged side by side; and
(c6) among the neighboring IDT blocks, the electrode finger disposed at an end portion is extended from the bus bar which connects the neighboring IDT blocks in series, and the end portion is located next to the space area on the IDT block that is closer to the connected signal port.

2. The acoustic wave filter according to claim 1, wherein the interval between the neighboring IDT blocks is set to a dimension equal to or more than $\lambda a/4$, wherein a dimension corresponding to the period unit is set as $\lambda a$.

3. The acoustic wave filter according to claim 1, wherein the interval between the neighboring IDT blocks is set to a value, which is $(\lambda a/4) \times n \times \alpha$, wherein n is natural number equal to or more than 1, and $\alpha$ is 1.0005 to 1.07.

4. The acoustic wave filter according to claim 1, wherein, in the group of the period unit cyclically repeated along the acoustic wave propagation direction, the period unit includes:

three neighboring electrode fingers extending from one of the bus bars; and a single electrode finger neighboring to the three electrode fingers and extending from the other bus bar out of the pair of bus bars.

5. The acoustic wave filter according to claim 1, wherein, in the group of the period unit cyclically repeated along the acoustic wave propagation direction, the period unit includes:

a single electrode finger and a reflection electrode, disposed in neighboring and extending from one of the bus bars; and a single electrode finger, neighboring to a set of the single electrode finger and the reflection electrode and extending from the other bus bar out of the pair of bus bars.

6. The acoustic wave filter according to claim 1, wherein, in the group of the period unit cyclically repeated along the acoustic wave propagation direction, the period unit includes:

four neighboring electrode fingers extending from one of the bus bars.

* * * * *